(12) United States Patent
Jin et al.

(10) Patent No.: US 12,249,615 B2
(45) Date of Patent: Mar. 11, 2025

(54) IMAGE SENSOR WITH A DEVICE ISOLATION STRUCTURE ENCLOSING A PLURALITY OF PIXELS INCLUDING AN OPENING IN PLAN VIEW

(71) Applicant: SAMSUNG ELECTRONICS CO., LTD., Suwon-si (KR)

(72) Inventors: Younggu Jin, Suwon-si (KR); Youngchan Kim, Suwon-si (KR); Yonghun Kwon, Suwon-si (KR)

(73) Assignee: SAMSUNG ELECTRONICS CO., LTD., Suwon-si Gyeonggi-do (KR)

( * ) Notice: Subject to any disclaimer, the term of this patent is extended or adjusted under 35 U.S.C. 154(b) by 0 days.

(21) Appl. No.: 18/199,601

(22) Filed: May 19, 2023

(65) Prior Publication Data

US 2023/0411423 A1    Dec. 21, 2023

(30) Foreign Application Priority Data

May 25, 2022   (KR) .................. 10-2022-0064248

(51) Int. Cl.
*H01L 27/146*        (2006.01)

(52) U.S. Cl.
CPC ........ *H01L 27/1463* (2013.01); *H01L 27/146* (2013.01); *H01L 27/14603* (2013.01); *H01L 27/14609* (2013.01); *H01L 27/14612* (2013.01); *H01L 27/14614* (2013.01); *H01L 27/14627* (2013.01); *H01L 27/14645* (2013.01); *H01L 27/14654* (2013.01); *H01L 27/14656* (2013.01)

(58) Field of Classification Search
CPC ............... H01L 27/1463; H01L 27/146; H01L 27/14603; H01L 27/14609; H01L 27/14612; H01L 27/14614; H01L 27/14627; H01L 27/14645; H01L 27/14654; H01L 27/14656
See application file for complete search history.

(56) References Cited

U.S. PATENT DOCUMENTS

| | | |
|---|---|---|
| 9,083,905 B2 | 7/2015 | Wan et al. |
| 9,966,407 B2 | 5/2018 | Kim et al. |
| 10,700,115 B2 | 6/2020 | Choi et al. |
| 11,128,823 B2 | 9/2021 | Machida et al. |
| 11,218,653 B2 | 1/2022 | Yang et al. |
| 2016/0056199 A1* | 2/2016 | Kim ............. H04N 25/771 257/233 |
| 2018/0167567 A1* | 6/2018 | Malinge ............. H04N 25/621 |
| 2019/0019820 A1* | 1/2019 | Takizawa ............. H04N 25/771 |
| 2020/0412995 A1 | 12/2020 | Seo et al. |

(Continued)

FOREIGN PATENT DOCUMENTS

KR    10-2023-0036720 A    3/2023

*Primary Examiner* — Jennifer D Bennett
(74) *Attorney, Agent, or Firm* — Muir Patent Law, PLLC

(57) ABSTRACT

An image sensor includes a substrate having a plurality of unit pixels, a photoelectric device portion and a storage device portion disposed in the substrate and constituting the plurality of unit pixels, a device isolation structure disposed in the substrate and partitioning the plurality of unit pixels, and an overflow gate providing an overflow path between the photoelectric device portion and the storage device portion according to a certain voltage, wherein the device isolation structure is partially opened at a boundary between the photoelectric device portion and the storage device portion.

20 Claims, 18 Drawing Sheets

(56) References Cited

U.S. PATENT DOCUMENTS

2021/0112212 A1*  4/2021  Oh ......................... H04N 25/59
2022/0070396 A1*  3/2022  Amikawa ............ H04N 25/771
2023/0076177 A1   3/2023  Lim et al.

* cited by examiner

C-C'

B-B'

B-B'

C-C'

D-D'

IMAGE SENSOR WITH A DEVICE ISOLATION STRUCTURE ENCLOSING A PLURALITY OF PIXELS INCLUDING AN OPENING IN PLAN VIEW

CROSS-REFERENCE TO RELATED APPLICATION

This application is based on and claims priority under 35 U.S.C. § 119 to Korean Patent Application No. 10-2022-0064248, filed on May 25, 2022, in the Korean Intellectual Property Office, the disclosure of which is incorporated by reference herein in its entirety.

BACKGROUND

1. Field

Embodiments relate to an image sensor, and more particularly, to an image sensor including a photoelectric device portion and a storage device portion.

2. Description of the Related Art

An image sensor is a device that converts an optical image signal into an electrical signal. The image sensor has a plurality of pixels, and each pixel includes a photoelectric device portion that receives incident light and converts the light into an electric signal, and a pixel circuit that outputs a pixel signal using electric charges generated by the photoelectric device portion. An increase in the degree of integration of the image sensor leads to a reduction in the size of each pixel.

SUMMARY

According to embodiments, there is provided an image sensor including a substrate including a plurality of unit pixels, a photoelectric device portion and a storage device portion disposed in the substrate and constituting the plurality of unit pixels, a device isolation structure disposed in the substrate and partitioning the plurality of unit pixels, and an overflow gate providing an overflow path between the photoelectric device portion and the storage device portion according to a certain voltage, wherein the device isolation structure is partially opened at a boundary between the photoelectric device portion and the storage device portion.

According to embodiments, there is provided an image sensor including a photoelectric device portion covered by a micro lens and accumulating photocharges generated by incident light focused on the micro lens for a certain period of time, a storage device portion not covered by the micro lens and receiving and storing some of the photocharges accumulated in the photoelectric device portion, a device isolation structure surrounding the photoelectric device portion and the storage device portion and partially opened at a boundary between the photoelectric device portion and the storage device portion, and an overflow gate disposed in a region in which the device isolation structure is opened between the photoelectric device portion and the storage device portion, chopping the certain period of time, and providing an overflow path.

According to embodiments, there is provided an image sensor including a substrate including a plurality of unit pixels, a photoelectric device portion and a storage device portion disposed in the substrate and constituting the plurality of unit pixels, a device isolation structure surrounding the plurality of unit pixels and partially opened at a boundary between the photoelectric device portion and the storage device portion, an overflow gate disposed in a region in which the device isolation structure is opened and providing an overflow path for transferring some of photocharges overflowing from the photoelectric device portion to the storage device portion, a first transfer gate transferring the photocharges stored in the photoelectric device portion to a first floating diffusion region, and a second transfer gate transferring the photocharges stored in the storage device portion to a second floating diffusion region.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
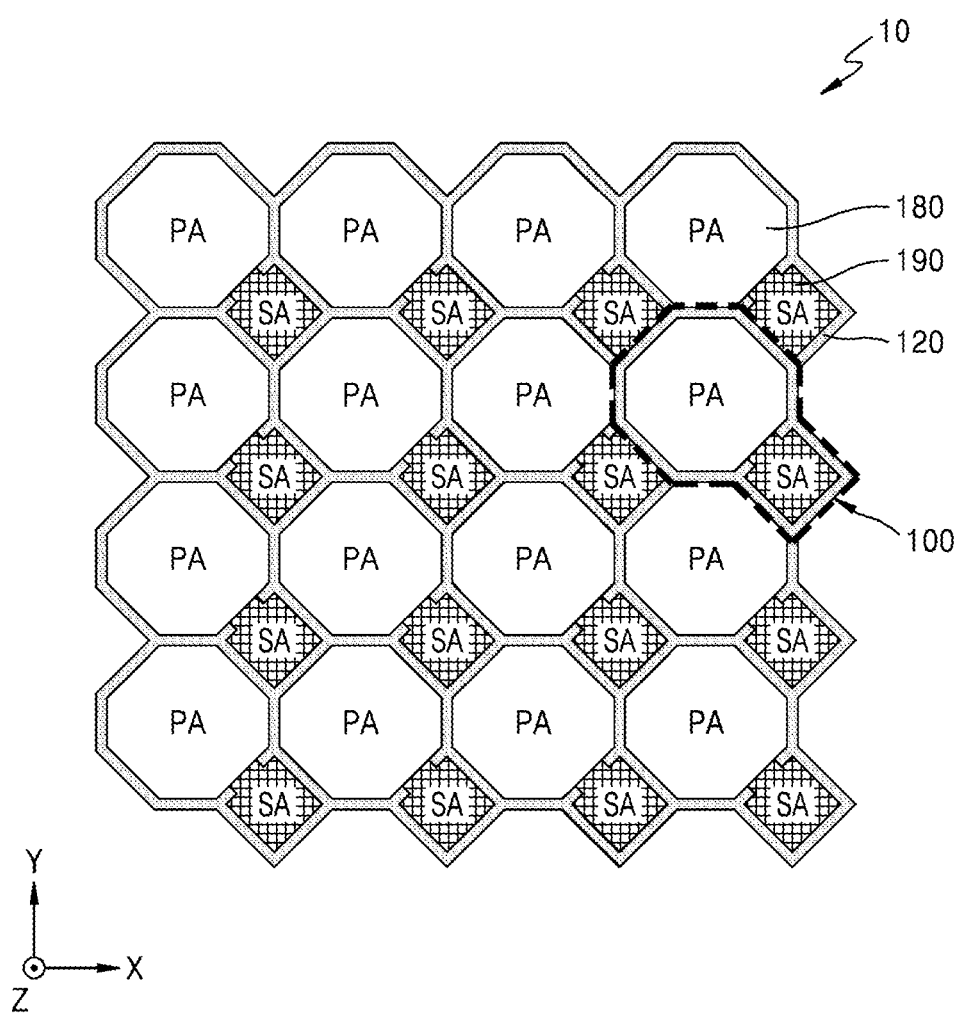
FIG. 1 is a layout schematically illustrating a pixel array of an image sensor according to an embodiment.

FIG. 1 is a layout schematically illustrating a pixel array of an image sensor 10 according to an embodiment.

Referring to FIG. 1, the pixel array of the image sensor 10 includes sixteen (16) unit pixels 100 arranged in the form of a 4×4 matrix having four rows and four columns. It is noted, however, that the number of unit pixels 100 in FIG. 1 is exemplary and may be implemented in the form of an N×M matrix (where N and M are each a natural number).

The unit pixels 100 arranged in the form of the 4×4 matrix have a shape arranged in parallel or perpendicular to each of a first horizontal direction (X direction) and a second horizontal direction (Y direction). Each of the plurality of unit pixels 100 may include a photoelectric device portion PA and a storage device portion SA. Each unit pixel 100 may include a micro lens 180 concentrating incident light irradiated through an optical lens to the center of the photoelectric device portion PA.

The photoelectric device portion PA may be a region including a photodiode PD (see FIG. 2B) accumulating photocharges generated according to incident light. The photodiode PD (see FIG. 2B) may have an area occupying most of the photoelectric device portion PA.

The center of the photoelectric device portion PA may substantially coincide with, e.g., be aligned with, the center of the micro lens 180. Accordingly, the micro lens 180 may focus the incident light on the photodiode PD (see FIG. 2B). The micro lens 180 may be transparent.

The storage device portion SA may be a region including a storage diode (SD, see FIG. 2B) temporarily storing some of the photocharges accumulated in the photodiode (PD, see FIG. 2B), so as to implement a high dynamic range (HDR) operation. The storage diode SD (see FIG. 2B) may have an area occupying most of the storage device portion SA.

The storage device portion SA may be disposed neighboring, e.g., adjacent, to the photoelectric device portion PA of the same unit pixel 100, and a direction in which the photoelectric device portion PA and the storage device portion SA are arranged may be oblique to the first horizontal direction (X direction) and the second horizontal direction (Y direction). For example, the storage device portion SA may be disposed in a direction of about 45° with respect to the photoelectric device portion PA.

For example, the micro lens 180 may be formed to correspond only to the photoelectric device portion PA. Here, that the micro lens 180 corresponds to the photoelectric device portion PA means that the micro lens 180 has an area corresponding to an area of the photoelectric device portion PA, e.g., in terms of size and/or shape, and is formed such that most of the area thereof overlaps, e.g., in the vertical direction, the area of the photoelectric device portion PA.

In another example, the micro lens 180 may be formed not to correspond to the storage device portion SA. That is, the micro lens 180 may have an area that does not correspond to an area of the storage device portion SA, and may be formed such that the area thereof does not mostly overlap the area of the storage device portion SA.

This means that when each of the micro lenses 180 is disposed in the pixel array of the image sensor 10, the storage device portion SA may be disposed in an empty space between the neighboring micro lenses 180. Therefore, the photoelectric device portions PA are formed to respectively correspond to the micro lenses 180 as much as possible, and each of the storage device portions SA is formed in a region excluding the photoelectric device portion PA, thereby increasing the arrangement efficiency and the degree of integration of the unit pixels 100. In addition, a light blocking pattern 190 may be formed to correspond only to the storage device portion SA, thereby increasing light reception efficiency and reducing light leakage.

Each of the plurality of unit pixels 100 may be partitioned by a device isolation structure 120. The device isolation structure 120 may be formed, e.g., continuously, along the, e.g., entire, edge (or boundary) of the unit pixel 100 to electrically and/or optically separate the neighboring unit pixels 100 from each other. The device isolation structure 120 may prevent crosstalk that light incident to the photoelectric device portion PA of the unit pixel 100 transmits through the photoelectric device portion PA of another neighboring unit pixel 100 and reduces a signal-to-noise ratio.

Further, the image sensor 10 according to an embodiment may include the device isolation structure 120 which is disposed along a boundary region between the photoelectric device portion PA and the storage device portion SA, and of which a part is opened. For example, as illustrated in FIG. 1, the device isolation structure 120 may extend along only a part of the boundary region between the photoelectric device portion PA and the storage device portion SA to define an opening therebetween. As such, the unit pixel 100 may provide an overflow path for transferring photocharges overflowing from the photoelectric device portion PA to the storage device portion SA, by using an overflow gate OG (see FIG. 2C) disposed in the boundary region where the device isolation structure 120 is opened. A detailed description thereof will be provided below.

Ultimately, the image sensor 10 according to an embodiment may efficiently implement the HDR operation while increasing the arrangement efficiency and the degree of integration of the unit pixels 100.

Figure 2A:
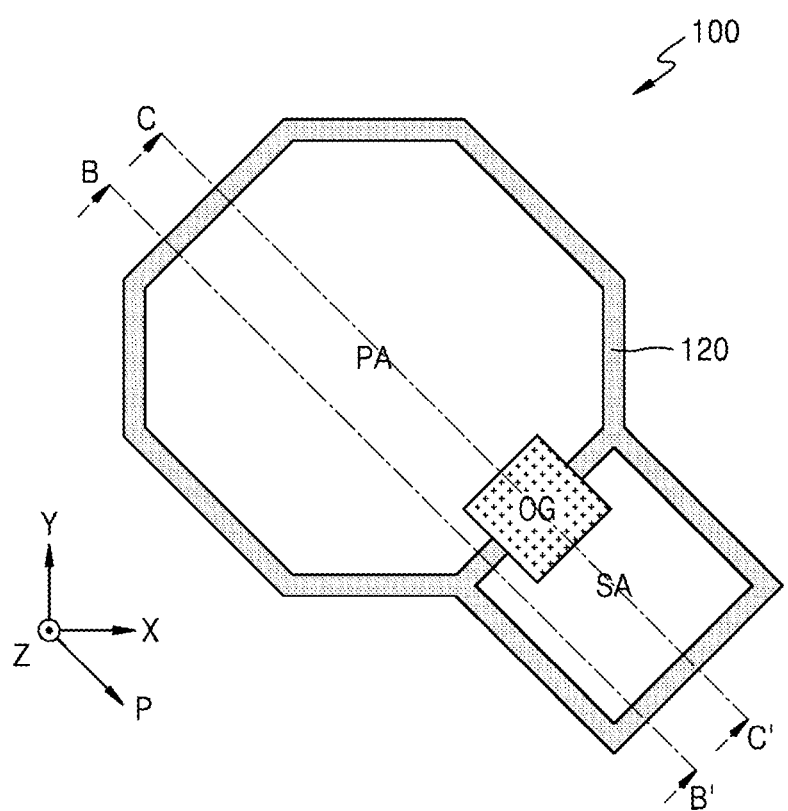
FIG. 2A is a plan view schematically showing a unit pixel of an image sensor according to an embodiment.
Figure 2B:
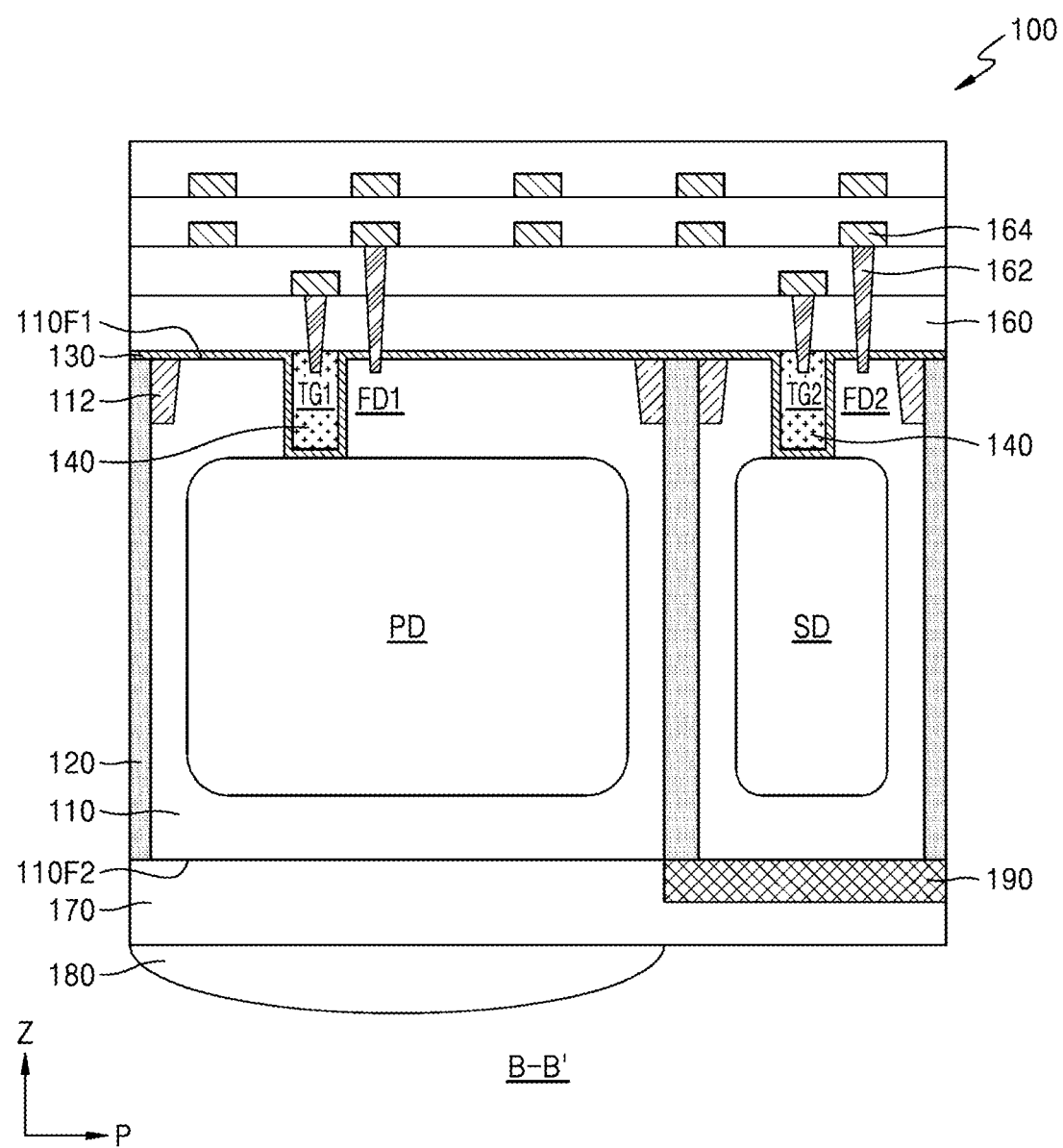
FIG. 2B is a cross-sectional view taken along line B-B' of FIG. 2A.
Figure 2C:
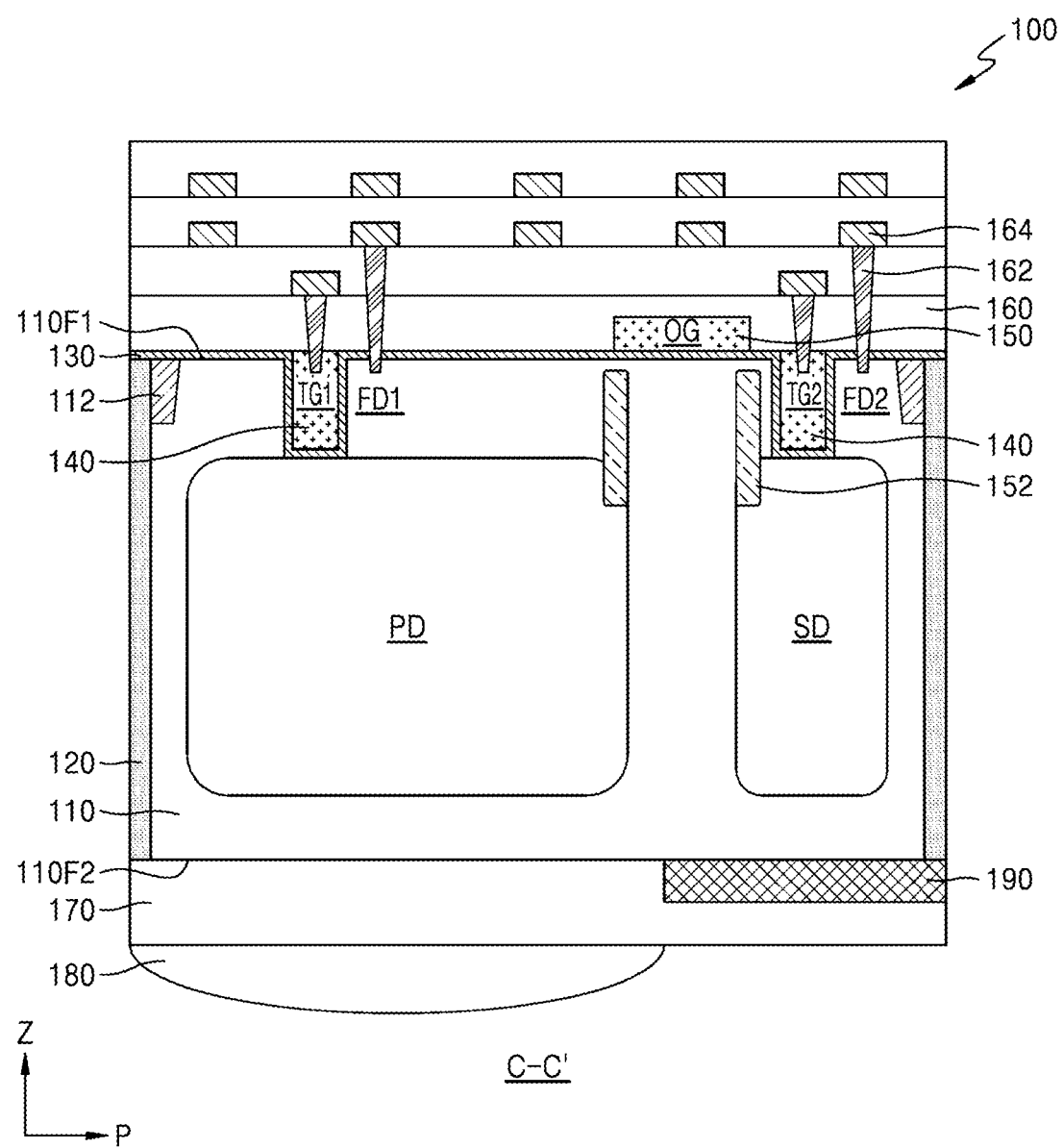
FIG. 2C is a cross-sectional view taken along line C-C' of FIG. 2A.

FIG. 2A is a plan view schematically showing the unit pixel 100 of the image sensor 10 according to an embodiment, FIG. 2B is a cross-sectional view taken along line B-B' of FIG. 2A, and FIG. 2C is a cross-sectional view taken along line C-C' of FIG. 2A.

Referring to FIG. 2A, the unit pixel 100 of the image sensor 10 (see FIG. 1) may include the device isolation structure 120 which is partially opened along a boundary region between the photoelectric device portion PA and the storage device portion SA. That is, as illustrated in FIG. 2A, the device isolation structure 120 may continuously extend along an entire perimeter of the unit pixel 100, i.e., may continuously extend along an entire combined perimeter of the photoelectric device portion PA and the storage device portion SA. Further, the device isolation structure 120 may partially extend along a boundary between the photoelectric device portion PA and the storage device portion SA, such that an opening is formed in the device isolation structure 120 to allow fluid communication between the photoelectric device portion PA and the storage device portion SA. The overflow gate OG may be disposed in the boundary region between the photoelectric device portion PA and the storage device portion SA where the device isolation structure 120 is open, e.g., the overflow gate OG may be positioned in the opening of the device isolation structure 120 between the photoelectric device portion PA and the storage device portion SA. A portion of the device isolation structure 120 along the boundary region between the photoelectric device portion PA and the storage device portion SA may be continuous and integral with a portion of the device isolation structure 120 surrounding a perimeter of the unit pixel 100.

Referring to FIGS. 2B and 2C, a substrate 110 may include a first surface 110F1 and a second surface 110F2 facing each other. For convenience of description, a surface of the substrate 110 on which a color filter 170 is disposed is referred to as the second surface 110F2, and a surface opposite to the second surface 110F2 is referred to as the first surface 110F1.

The substrate 110 may include a semiconductor substrate. For example, the substrate 110 may include any of Si, Ge, SiGe, SiC, GaAs, InAs, and InP. For example, the substrate 110 may be formed as a p-type silicon substrate. In some embodiments, the substrate 110 may include a p-type or n-type bulk substrate and a p-type or n-type epitaxial layer grown on the bulk substrate. Alternatively, the substrate 110 may be formed as an organic plastic substrate.

The plurality of unit pixels 100 may be arranged in the form of a matrix on the substrate 110. The device isolation structure 120 may be disposed in the substrate 110, and the plurality of unit pixels 100 may be defined by the device isolation structure 120. The device isolation structure 120 may be disposed at the edge of one of the plurality of unit pixels 100 and the unit pixel 100 neighboring thereto. One unit pixel 100 and another unit pixel 100 neighboring thereto, e.g., two unit pixels 100 adjacent to each other, may be physically and electrically separated from each other by the device isolation structure 120.

The device isolation structure 120 may be formed in a trench penetrating the substrate 110 from the first surface 110F1 to the second surface 110F2 of the substrate 110. The device isolation structure 120 may include an insulating layer conformally formed on a sidewall of the trench and a conductive layer filling the inside of the trench.

The expression that the device isolation structure 120 extends from the first surface 110F1 to the second surface 110F2 of the substrate 110 may be understood as including both a case where the device isolation structure 120 is formed to extend from the first surface 110F1 of the substrate 110 toward the second surface 110F2 and a case where the device isolation structure 120 is formed to extend from the second surface 110F2 of the substrate 110 toward the first surface 110F1.

In the drawing, a frontside deep trench isolation (FDTI) pattern in which the device isolation structure 120 penetrates, e.g., continuously, the substrate 110 from the first surface 110F1 to the second surface 110F2 of the substrate 110 is illustrated. As will be described below, in some embodiments, the device isolation structure 120 may extend from the second surface 110F2 of the substrate 110 toward the inside of the substrate 110, but may not be exposed to the first surface 110F1 of the substrate 110, e.g., the device isolation structure 120 may extend only partially between the first and second surfaces 110F1 and 110F2 of the substrate 110.

An isolation region 112 defining an active region may be formed on the first surface 110F1 of the substrate 110. The isolation region 112 may be formed to a certain depth on the first surface 110F1 of the substrate 110 and may include an insulating material. The isolation region 112 may be disposed to surround an upper sidewall of the device isolation structure 120.

A plurality of photodiodes PD may be respectively disposed in the plurality of unit pixels 100, e.g., in a one-to-one correspondence. The plurality of photodiodes PD may serve to convert light incident from the second surface 110F2 of the substrate 110 into an electrical signal. For example, the plurality of photodiodes PD may include n-type impurities.

Also, a plurality of storage diodes SD may be respectively disposed in the plurality of unit pixels 100, e.g., in a one-to-one correspondence. The plurality of storage diodes SD may serve to store photocharges overflowing from the plurality of photodiodes PD. For example, the plurality of storage diodes SD may include n-type impurities. The overflow gate OG may be disposed across the photodiode PD and the storage diode SD to provide an overflow path through which the overflow photocharges may move, as illustrated in FIGS. 2A and 2C. A detailed description thereof will be provided below.

Various transistors constituting a pixel circuit may be disposed in the active region of the substrate 110. For example, the active region may be a part of the substrate 110 on which transistors including a first transfer gate TG1, a second transfer gate TG2, and the overflow gate OG are disposed. In addition, the active region may include a first floating diffusion region FD1 and a second floating diffusion region FD2.

In some embodiments, the first and second transfer gates TG1 and TG2 may be formed as a vertical gate electrode 140 (e.g., a vertical gate structure), and the vertical gate electrode 140 may be disposed to extend into the substrate 110 from the first surface 110F1 of the substrate 110. For example, as illustrated in FIG. 2C, one vertical gate electrode 140 may extend lengthwise in the vertical direction, e.g., along the Z direction, from the first surface 110F1 of the substrate 110 toward each of the photodiode PD and the storage diode SD.

A gate insulating layer 130 may be conformally disposed on the first surface 110F1 of the substrate 110, and the vertical gate electrode 140 may fill a part of the substrate 110 on the gate insulating layer 130, e.g., top surfaces of the vertical gate electrode 140 and the gate insulating layer 130 may be coplanar with each other. An upper surface of the vertical gate electrode 140 may be disposed at a level higher than the first surface 110F1 of the substrate 110, e.g., relative to the second surface 110F2 of the substrate 110, and a lower surface of the vertical gate electrode 140 may be disposed at a lower level than the first surface 110F1 of the substrate 110, e.g., relative to the second surface 110F2 of the substrate 110. In some embodiments, the vertical gate electrode 140 may include at least one of, e.g., doped polysilicon, metal, metal silicide, metal nitride, or a metal-containing layer. The gate insulating layer 130 may include, e.g., silicon oxide or metal oxide.

In some embodiments, the overflow gate OG may be formed as a horizontal gate electrode 150, e.g., to extend lengthwise along the P direction. The horizontal gate electrode 150 may be disposed to extend on the substrate 110 along the first surface 110F1 of the substrate 110, e.g., the gate insulating layer 130 may be between the horizontal gate electrode 150 and the first surface 110F1 of the substrate 110. The horizontal gate electrode 150 may be referred to as a planar gate electrode. The overflow gate OG may be disposed between the photodiode PD and the storage diode SD. In a plan view, each of both sides, e.g., opposite sides, of the overflow gate OG may face the device isolation structure 120 (FIG. 2A), and in a side cross-section, the device isolation structure 120 may not be disposed on a lower surface of the overflow gate OG (FIG. 2C).

The overflow gate OG is used to transfer some of the overflow photocharges among photocharges generated by the photodiode PD to the storage diode SD. That is, the overflow gate OG generates an overflow path between the photodiode PD and the storage diode SD. To this end, a doped region 152 may be formed between the overflow gate OG and the photodiode PD and between the overflow gate OG and the storage diode SD, e.g., in the Z direction. In a plan view, an extending direction of the device isolation structure 120 disposed at the boundary between the photoelectric device portion PA and the storage device portion SA and a direction of the overflow path (e.g., the P direction in FIG. 2A) may be orthogonal to each other.

The overflow gate OG is turned on or off in response to a certain signal. For example, when the intensity of an incident light incident on the unit pixel 100 is very large (when the sun or a light bulb is captured, i.e., in a high illuminance state), the overflow gate OG may transfer some of the overflow photocharges of the photodiode PD to the storage diode SD, thereby efficiently implementing an HDR operation of the image sensor 10 (see FIG. 1). For an efficient overflow operation, the doped region 152 serving as an auxiliary movement path structure may be formed on an upper portion of the photodiode PD and an upper portion of the storage diode SD. The doped region 152 may be doped with the same type of impurities as the photodiode PD, and may have a lower doping concentration than that of the photodiode PD.

An insulating layer 160 may be disposed on the first surface 110F1 of the substrate 110. The insulating layer 160 may cover the gate insulating layer 130, the vertical gate electrode 140, and the horizontal gate electrode 150. For example, the insulating layer 160 may include an insulating material, e.g., silicon oxide, silicon nitride, or silicon oxynitride. In some embodiments, the insulating layer 160 may be formed in a stack structure of a multi-layer insulating material. An etch stop layer may be disposed between the insulating layer 160 and the first surface 110F1 of the substrate 110, and may include a material having an etch selectivity with respect to the insulating layer 160.

A contact structure 162 penetrating a part of the insulating layer 160 may be disposed on the first surface 110F1 of the substrate 110. For example, the contact structure 162 may pass through a part of the insulating layer 160 to be electrically connected to the first and second floating diffusion regions FD1 and FD2 of the active region.

A wiring structure 164 may be disposed in the insulating layer 160. The wiring structure 164 may be formed in a stack structure of a plurality of layers. Also, the wiring structure 164 may be surrounded by the insulating layer 160. The wiring structure 164 may include at least one of, e.g., doped polysilicon, metal, metal silicide, metal nitride, or a metal-containing layer. For example, the wiring structure 164 may include tungsten, aluminum, copper, tungsten silicide, titanium silicide, tungsten nitride, or titanium nitride.

The color filter 170 may be disposed on the second surface 110F2 of the substrate 110. The color filter 170 may be disposed to cover substantially the entire area of the second surface 110F2 of the substrate 110. The color filter 170 may contact the device isolation structure 120 at the same level as the second surface 110F2 of the substrate 110. In some embodiments, the color filter 170 may be a combination of green, blue, and red. In some embodiments, the color filter 170 may be a combination of cyan, magenta, and yellow.

The micro lens 180 may be disposed on the color filter 170. The micro lens 180 may be disposed to correspond to the photodiode PD. The micro lens 180 may be transparent. For example, the micro lens 180 may have a transmittance equal to or greater than about 90% with respect to incident light in a visible light region. The micro lens 180 may be formed of, e.g., styrene-based resin, acrylic resin, styrene-acrylic copolymer-based resin, or siloxane-based resin. The micro lens 180 may collect incident light, and the collected light may be incident on the photodiode PD through the color filter 170.

The light blocking pattern 190 may have an area corresponding to the storage diode SD and may be formed on the storage diode SD, e.g., the light blocking pattern 190 may vertically overlap an entire bottom of the storage diode SD and extend horizontally beyond the storage diode SD. The light blocking pattern 190 may block incident light irradiated through the color filter 170, e.g., surfaces of the light blocking pattern 190 and the color filter 170 directly contacting the second surface 110F2 of the substrate 110 may be coplanar with each other. A light leakage phenomenon may be minimized by such a light blocking pattern 190. For example, the light blocking pattern 190 may be made of a dark material, e.g., tungsten, and may be implemented in the form of a metal mesh.

As a result, the unit pixel 100 of the image sensor 10 (see FIG. 1) according to the embodiment may include the device isolation structure 120 which is partially opened along the boundary region between the photodiode PD and the storage diode SD. Also, in the unit pixel 100, the overflow gate OG may be disposed in the boundary region where the device isolation structure 120 is opened.

Figure 3:
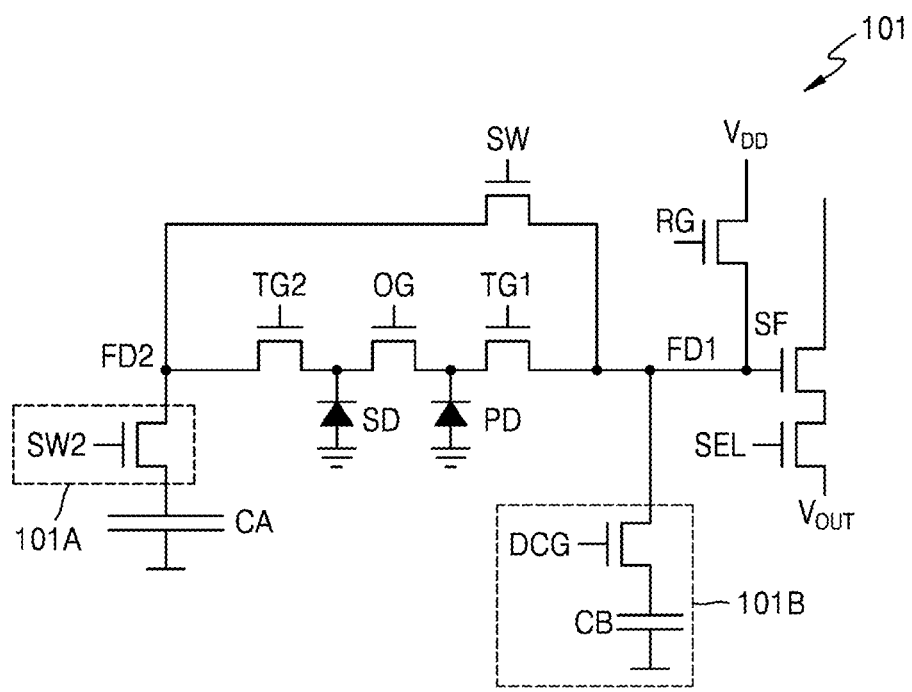
FIG. 3 is a circuit diagram illustrating a pixel circuit of an image sensor according to an embodiment.
Figure 4:
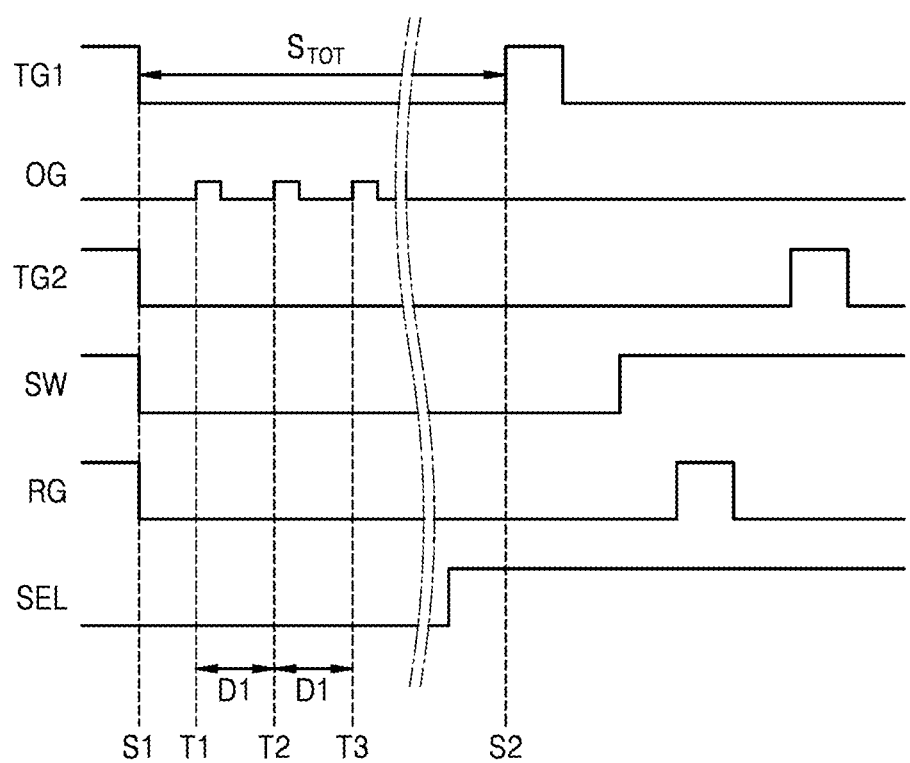
FIG. 4 is a timing diagram illustrating an operation of a pixel shown in FIG. 3.
Figure 5:
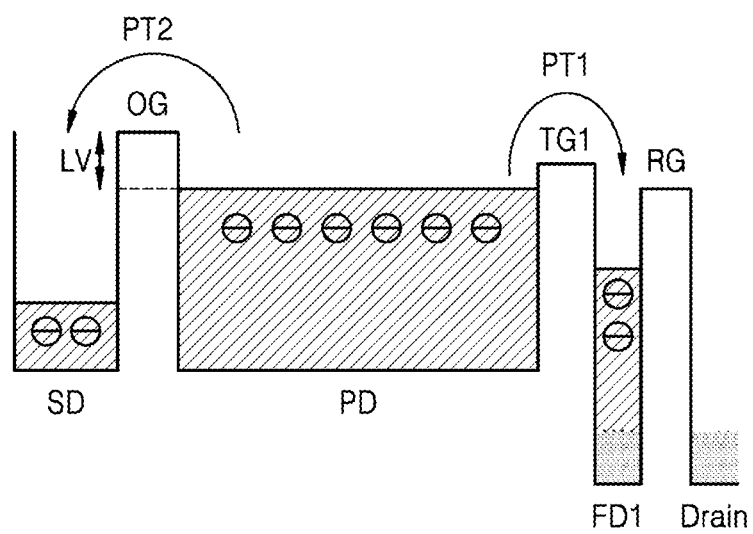
FIG. 5 is a graph illustrating a potential barrier of the pixel shown in FIG. 3.

FIG. 3 is a circuit diagram illustrating a pixel circuit 101 of the image sensor 10 according to an embodiment, FIG. 4 is a timing diagram illustrating an operation of a pixel shown in FIG. 3, and FIG. 5 is a graph illustrating a potential barrier of the pixel shown in FIG. 3. FIGS. 3 to 5 illustrate the pixel circuit 101 of the unit pixel 100 (see FIG. 1) of the image sensor 10 (see FIG. 1).

Referring to FIG. 3, a plurality of logic transistors may be included in the pixel circuit 101, and each of the plurality of logic transistors may include a gate driving the logic transistor. For example, the pixel circuit 101 may include a reset gate RG of a reset transistor, a source follower gate SF of a source follower transistor, and a selection gate SEL of a selection transistor.

The pixel circuit 101 of the present embodiment may include the first transfer gate TG1 of a first transfer transistor disposed on one side (a right side in the drawing) of the photodiode PD, the second transfer gate TG2 of a second transfer transistor disposed on one side (a left side in the drawing) of the storage diode SD, and the overflow gate OG of an overflow transistor disposed between the photodiode PD and the storage diode SD. That is, the photodiode PD, the overflow gate OG, and the storage diode SD may be sequentially disposed between the first transfer gate TG1 and the second transfer gate TG2.

In addition, the pixel circuit 101 may further include a switch device gate SW serving as a conversion gain gate. For example, the pixel circuit 101 may dynamically adjust a conversion gain of the pixel circuit 101 by turning on or off the switch device gate SW.

In some embodiments, the pixel circuit 101A may further include a second switch device gate SW2. The second switch device gate SW2 may control a high density capacitor CA to suppress read noise. For example, the second switch device gate SW2 and the high density capacitor CA may be connected to, e.g., around, the second floating diffusion region FD2.

In some embodiments, the pixel circuit 101B may be configured to further include a dual conversion gain gate DCG. The dual conversion gain gate DCG may serve to store photocharges overflowing from the photodiode PD to the first floating diffusion region FD1 in an additional capacitor CB.

The first transfer gate TG1 may transfer the photocharges generated by the photodiode PD to the first floating diffusion region FD1. The first floating diffusion region FD1 may receive, accumulate, and store the photocharges generated by the photodiode PD. The source follower gate SF may be controlled according to an amount of the photocharges accumulated in the first floating diffusion region FD1.

The second transfer gate TG2 may transfer photocharges stored in the storage diode SD to the second floating diffusion region FD2. The second floating diffusion region FD2 may receive, accumulate, and store the photocharges generated by the photodiode PD and the photocharges stored in the storage diode SD.

The reset gate RG may periodically reset the photocharges accumulated in the first floating diffusion region FD1. A drain electrode of the reset gate RG may be connected to the first floating diffusion region FD1, and a source electrode of the reset gate RG may be connected to a power voltage $V_{DD}$.

When the reset gate RG is turned on, the power voltage $V_{DD}$ connected to the source electrode of the reset gate RG may be transferred to the first floating diffusion region FD1.

Accordingly, the photocharges accumulated in the first floating diffusion region FD1 may be discharged, and the first floating diffusion region FD1 may be reset.

The source follower gate SF may be connected to a current source located outside the unit pixel 100 (see FIG. 1) to function as a source follower buffer amplifier, amplify a potential change in the first floating diffusion region FD1, and output the potential change to an output line $V_{OUT}$.

The selection gate SEL may select the plurality of unit pixels 100 (see FIG. 1) in a row unit, and when the selection gate SEL is turned on, the power voltage $V_{DD}$ may be transferred to the source electrode of the source follower gate SF.

The overflow gate OG is disposed between the photodiode PD and the storage diode SD. The overflow gate OG is used to control the photocharges generated by the photodiode PD to overflow to the storage diode SD. The overflow gate OG may be turned on or off in response to a certain signal.

For example, when the intensity of incident light incident on the unit pixel 100 (see FIG. 1) is very large (when the sun or a light bulb is captured, i.e., in a high illuminance state), the overflow gate OG may transfer some of the overflow photocharges of the photodiode PD to the storage diode SD, thereby efficiently implementing a HDR operation of the image sensor 10 (see FIG. 1).

As shown in FIG. 4, with regard to a driving voltage of each gate over time, the overflow gate OG may operate in a chopping method of chopping the total time taken to accumulate photocharges generated by incident light. The image sensor 10 (see FIG. 1) may be driven by applying a general lateral overflow integration capacitor (LOFIC) operation method, and additionally applying the chopping method with respect to the total time taken to accumulate photocharges. By applying such a chopping method, the overflow path may be repeatedly generated and destroyed with a constant interval D1 during the total time taken to accumulate the photocharges. For example, the overflow path may be formed at first to third time points T1, T2, and T3, and the first to third time points T1, T2, and T3 may have the same interval D1.

A ratio of an on time to an off time of the overflow gate OG may perform substantially the same function as a sensitivity ratio. The on voltage of the overflow gate OG may be set to be small enough to allow the overflow path.

During the on time of the overflow gate OG, an overflow of photocharges from the photodiode PD to the storage diode SD is allowed. However, when the overflow of photocharges exceeds the acceptance limit of the storage diode SD, the photocharges may be stored in the high density capacitor CA beyond the second floating diffusion region FD2.

During the off time of the overflow gate OG, the overflow of photocharges from the photodiode PD to the first floating diffusion region FD1 proceeds. However, when the overflow of photocharges exceeds the acceptance limit of the first floating diffusion region FD1, the photocharges may be drained beyond the reset gate RG.

During an accumulation time $S_{TOT}$ defined from a first light receiving time S1 to a second light receiving time S2, the photodiode PD accumulates the photocharges using incident light. From the first light receiving time S1 to the second light receiving time S2, the overflow gate OG may be turned on at the first to third time points T1, T2, and T3, and may allow the overflow path for a certain period of time, e.g., a predetermined period of time, at each time point. The on time of the overflow gate OG is not limited to three, and may be more or less than three. For example, the ratio of the on time to the off time of the overflow gate OG described above may be controlled to about 10%. In addition, the first transfer gate TG1 may also additionally apply a chopping operation as a voltage change in the opposite direction to the overflow gate OG so that the overflow of photocharges to the first floating diffusion region FD1 smoothly proceeds during the off time of the overflow gate OG.

The first to third time points T1, T2, and T3 are controlled to have the same interval D1, and thus, an image signal may be sampled in a high illuminance region. The image signal of the high illuminance region may refer to a pixel signal output according to a voltage level of the second floating diffusion region FD2 after the transfer of charges stored in the storage diode SD to the second floating diffusion region FD2 is completed.

As shown in FIG. 5, specifically with regard to the transfer of photocharges according to the potential barrier, first, photocharges may be accumulated in the photodiode PD surrounded by a region having a high potential barrier. When photocharges exceed the acceptance limit of the photodiode PD due to very strong light, the photocharges pass the potential barrier and may move to the first floating diffusion region FD1 (a first path PT1 in the drawing), resulting in a signal with high noise or acting as a signal loss, or may move to the storage diode SD controlled by the overflow gate OG (a second path PT2 in the drawing).

In a general image sensor, i.e., an image sensor without the second path PT2, all the overflow photocharges move only to the first path PT1, making it difficult to implement a clear image in a high illuminance situation exceeding the acceptance limit of the photodiode PD. In contrast, in the image sensor 10 according to embodiments, the second path PT2 exists, and thus, some of the overflow photocharges may move to the second path PT2 generated by the overflow gate OG and be stored in the storage diode SD for a planned period of time.

In some embodiments, a level LV of the potential barrier of the overflow gate OG may vary based on an operating state of the image sensor 10. For example, the level LV of the potential barrier may vary based on a high illuminance situation and a low illuminance situation, and may be lowered as the high illuminance situation increases. Here, the level LV of the potential barrier needs to vary within the range by which the storage diode SD may be maintained.

Figure 6A:
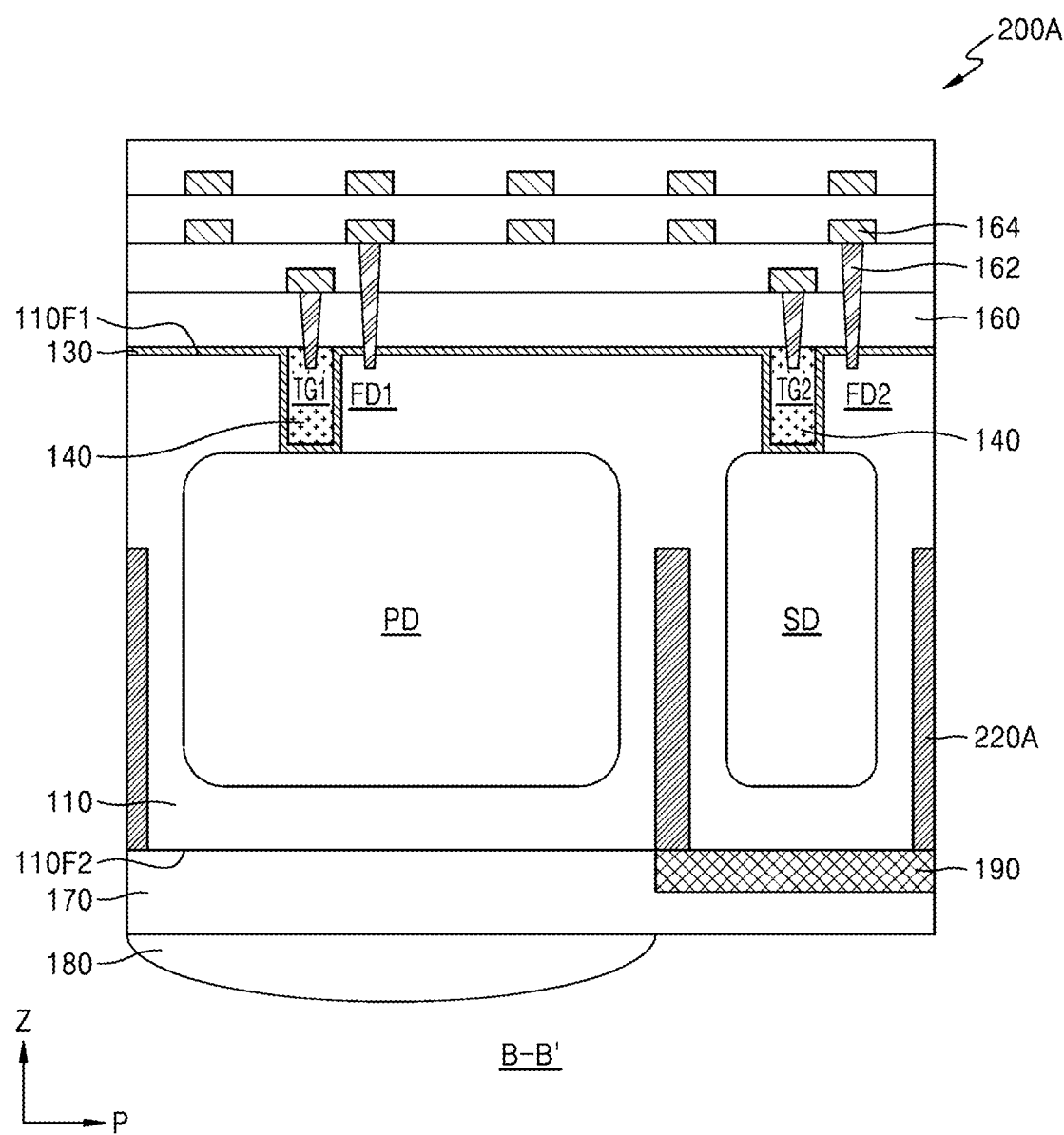
FIGS. 6A and 6B are cross-sectional views illustrating unit pixels of an image sensor according to an embodiment.
Figure 6B:
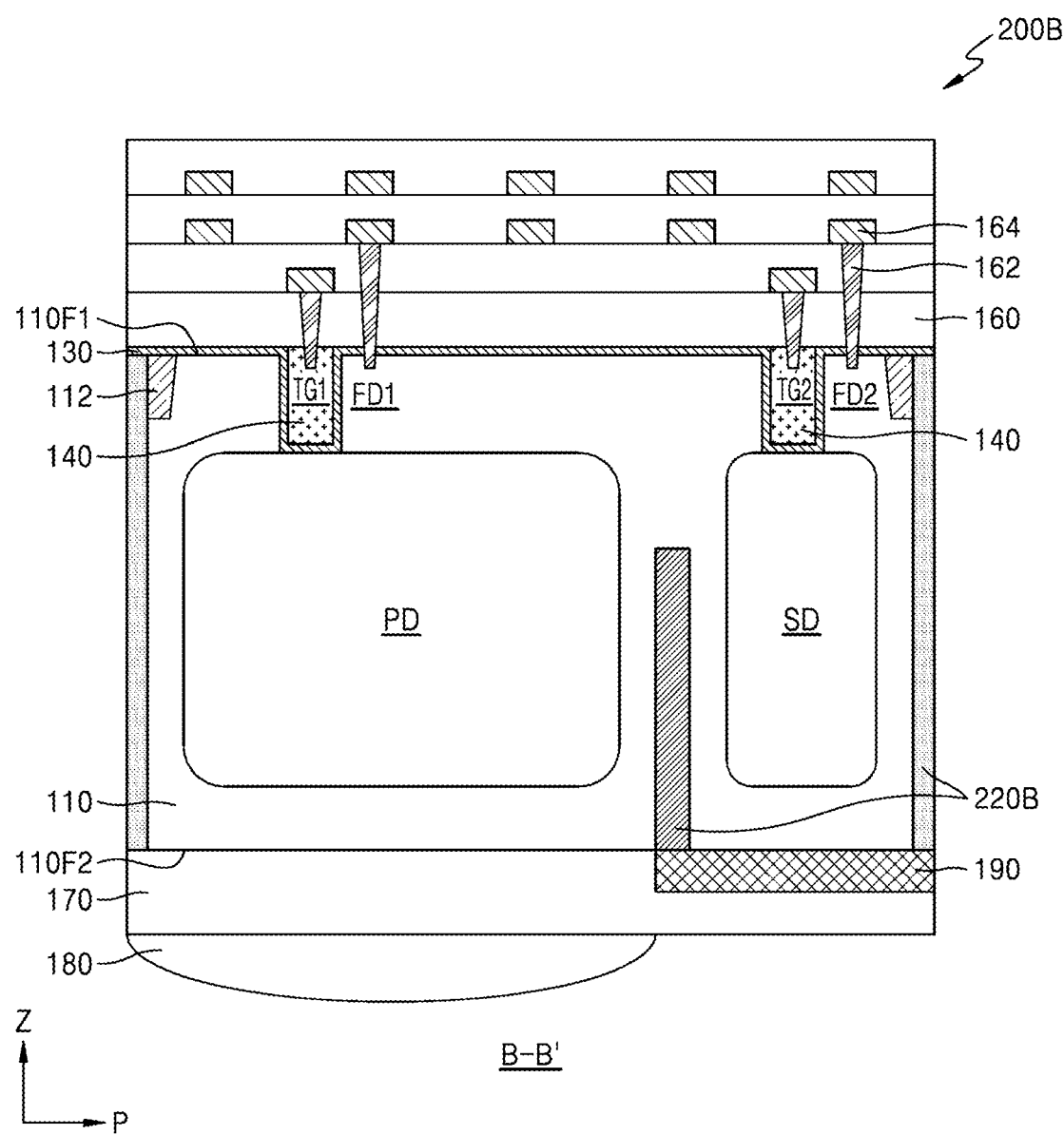

FIGS. 6A and 6B are cross-sectional views respectively illustrating unit pixels 200A and 200B of the image sensor 10 according to an embodiment. Specifically, each of FIGS. 6A and 6B is a cross-sectional view taken along line B-B' of FIG. 2A. For convenience of description, only differences between the unit pixels 200A and 200B and the unit pixel 100 described above will be described.

Referring to FIG. 6A, the unit pixel 200A of the image sensor 10 (see FIG. 1) may include a device isolation structure 220A which is partially opened along a boundary region between the photoelectric device portion PA and the storage device portion SA. In the unit pixel 200A of the present embodiment, the device isolation structure 220A may extend from the second surface 110F2 of the substrate 110 toward the first surface 110F1 of the substrate 110 in a vertical direction (Z direction), but the device isolation structure 220A may be formed so as not reach the first surface 110F1 of the substrate 110, e.g., the device isolation structure 220A may extend only partially between the first and second surfaces 110F1 and 110F2.

The device isolation structure 220A may physically and electrically separate one photodiode PD from a neighboring photodiode PD. Here, the device isolation structure 220A may be formed in a backside deep trench isolation (BDTI) pattern. In addition, the BDTI pattern may be formed between the photodiode PD and the storage diode SD in one unit pixel 200A, except for an open region between the photodiode PD and the storage diode SD.

Referring to FIG. 6B, the unit pixel 200B of the image sensor 10 (see FIG. 1) may include a device isolation structure 220B which is partially opened along the boundary region between the photoelectric device portion PA and the storage device portion SA. In the unit pixel 200B of the present embodiment, the device isolation structure 220B may include an FDTI pattern extending from the first surface 110F1 of the substrate 110 toward the second surface 110F2 of the substrate 110 in the vertical direction (Z direction) and the BDTI pattern extending from the second surface 110F2 of the substrate 110 toward the first surface 110F1 of the substrate 110 in the vertical direction (Z direction) together. That is, the device isolation structure 220B may include a hybrid pattern, e.g., the device isolation structure 220B may include portions that extend along an entire thickness of the substrate 110 as well as portions that extend only partially within the substrate 110.

The device isolation structure 220B may physically and electrically separate one photodiode PD from the neighboring photodiode PD using the FDTI pattern, e.g., adjacent photodiodes PD may be separated from each other by the portion of the device isolation structure 220B that extends along an entire thickness of the substrate 110. In addition, the BDTI pattern may be formed between the photodiode PD and the storage diode SD in one unit pixel 200B, except for an open region, e.g., the photodiode PD may be separated from the storage diode SD by the portion of the device isolation structure 220B that extends only partially along the thickness of the substrate 110.

Figure 7:
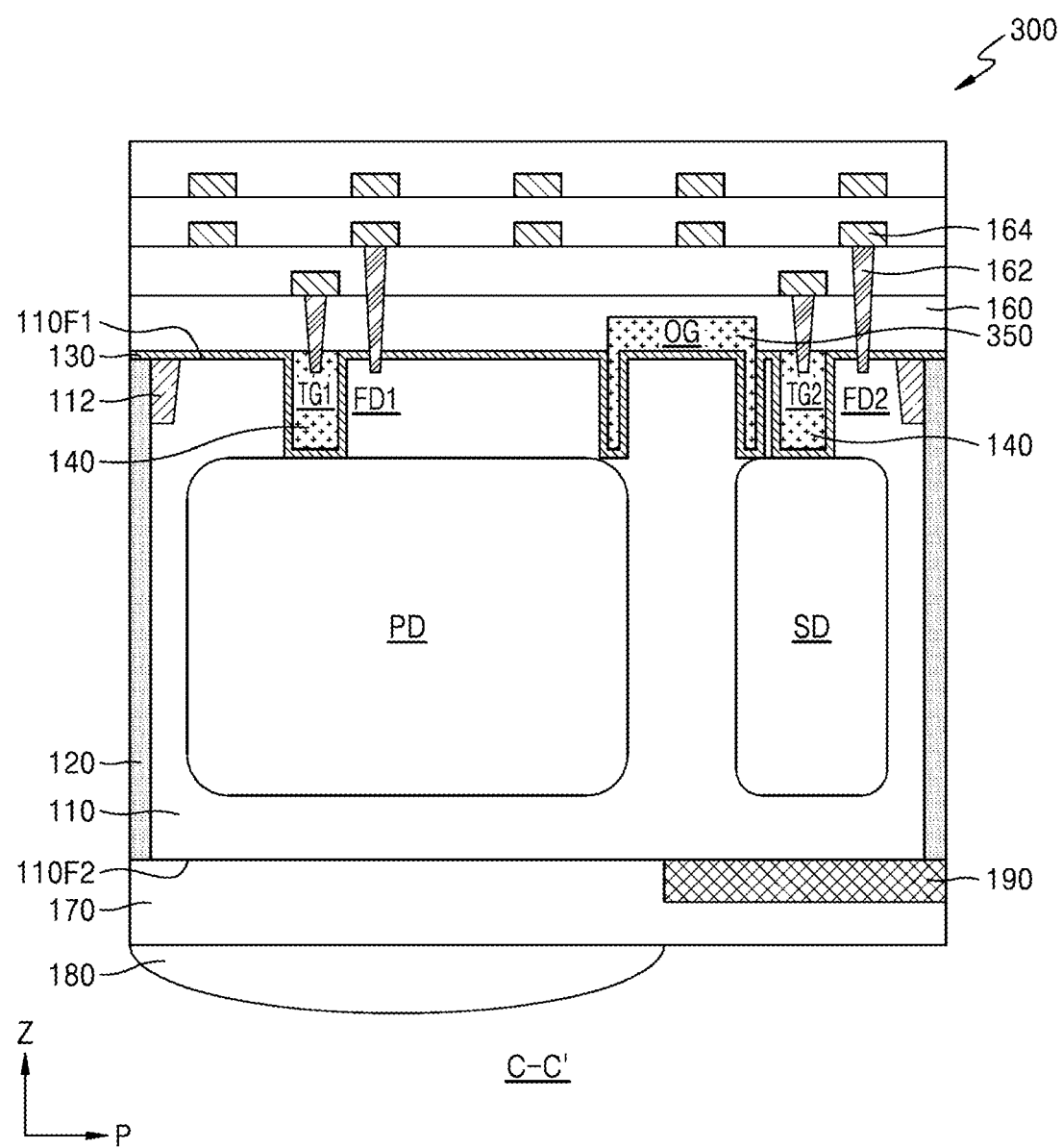
FIG. 7 is a cross-sectional view illustrating a unit pixel of an image sensor according to an embodiment.

FIG. 7 is a cross-sectional view illustrating a unit pixel 300 of the image sensor 10 according to an embodiment. FIG. 7 is a cross-sectional view along line C-C' of FIG. 2A. For convenience of description, only differences between the unit pixel 300 and the unit pixel 100 described above will be described.

Referring to FIG. 7, the unit pixel 300 of the image sensor 10 (see FIG. 1) may include the device isolation structure 120 which is partially opened along a boundary region between the photoelectric device portion PA and the storage device portion SA. In the unit pixel 300 of the present embodiment, the overflow gate OG may be formed as a vertical gate electrode 350 (e.g., rather than a horizontal gate electrode).

The vertical gate electrode 350 may be disposed to extend from the first surface 110F1 of the substrate 110 into the substrate 110. The gate insulating layer 130 may be conformally disposed on the first surface 110F1 of the substrate 110, and the vertical gate electrode 350 may fill a part of the substrate 110 on the gate insulating layer 130.

In the overflow gate OG, an upper surface of the vertical gate electrode 350 may be disposed at a higher level than the first surface 110F1 of the substrate 110, and a lower surface of the vertical gate electrode 350 may be disposed at a lower level than the first surface 110F1 of the substrate 110. In some embodiments, the vertical gate electrode 350 may include at least one of, e.g., doped polysilicon, metal, metal silicide, metal nitride, or a metal-containing layer.

Figure 8A:
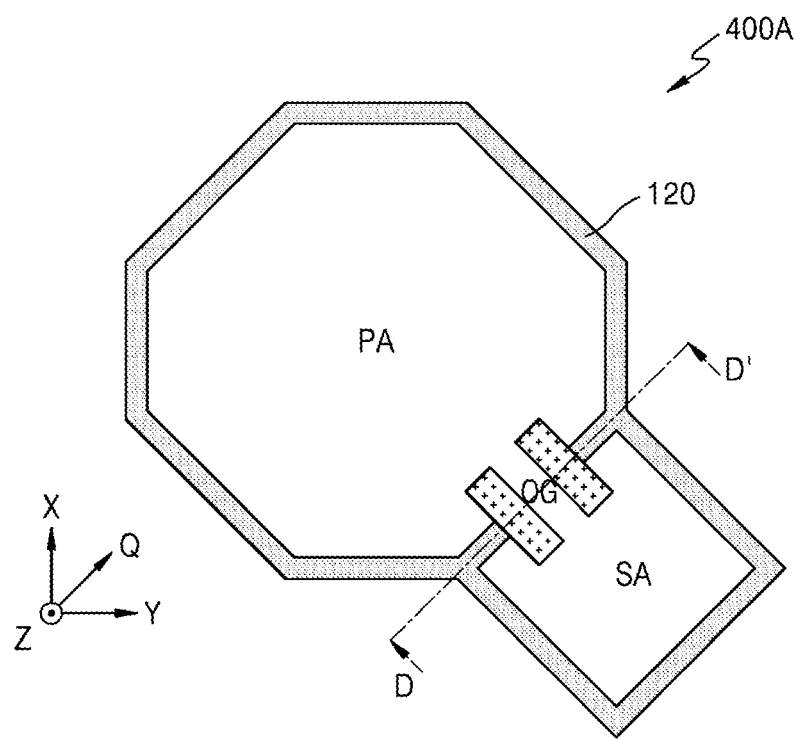
FIGS. 8A and 8B are diagrams illustrating unit pixels of an image sensor according to an embodiment.
Figure 8A:
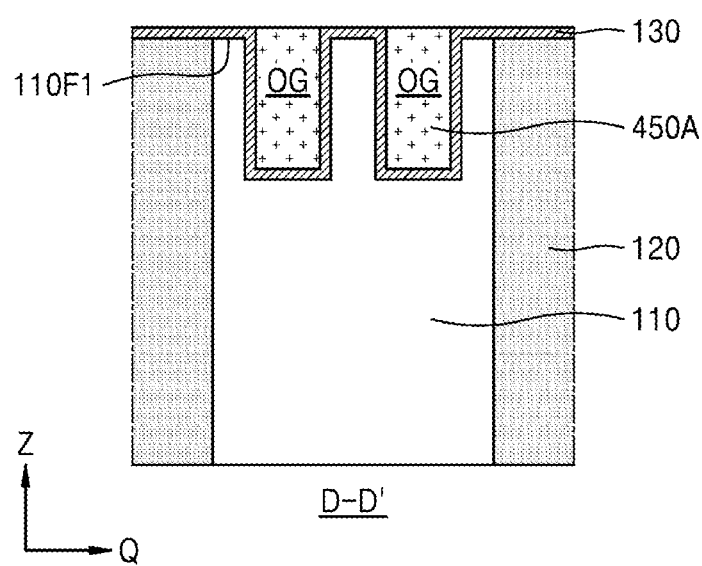
Figure 8B:
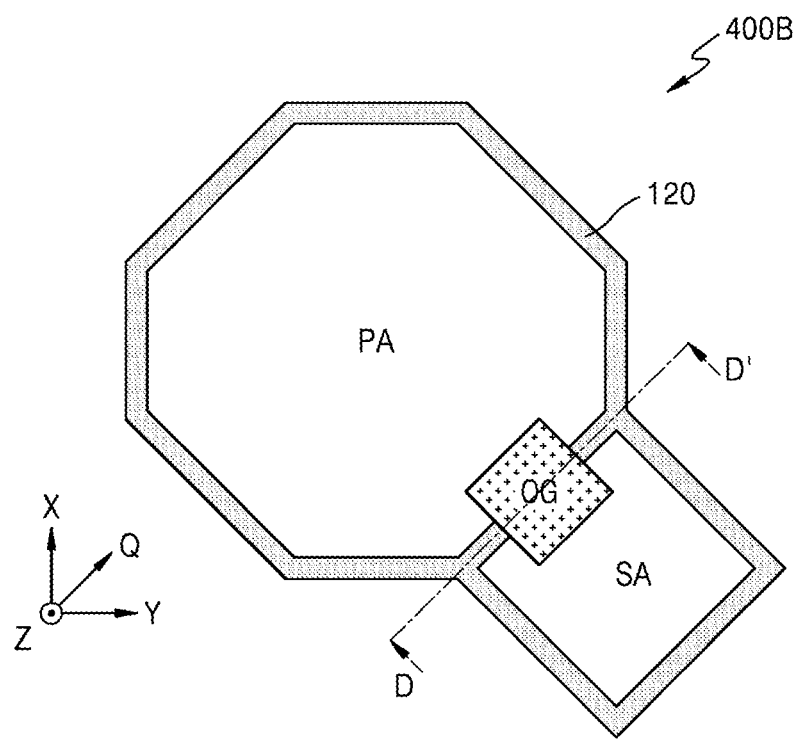
Figure 8B:
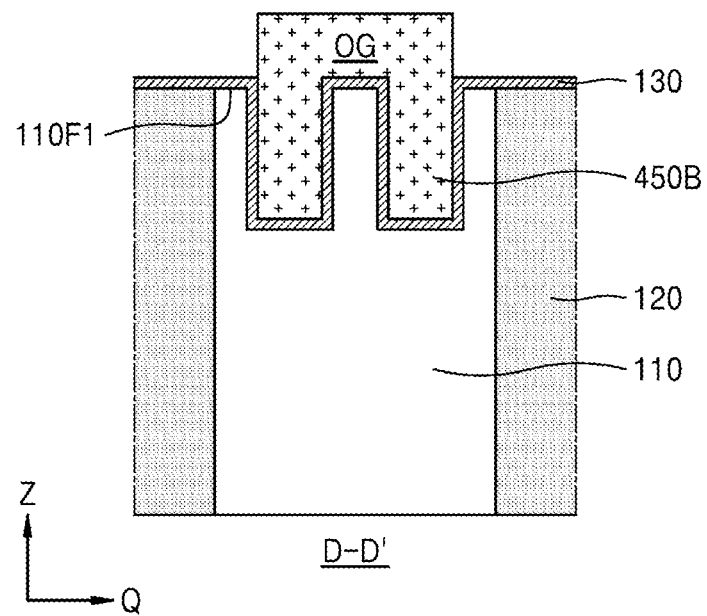

FIGS. 8A and 8B are diagrams respectively illustrating unit pixels 400A and 400B of the image sensor 10 according to an embodiment. In detail, upper sides of FIGS. 8A and 8B illustrate plan views of the unit pixels 400A and 400B, respectively, and lower sides thereof illustrate cross-sectional views along line D-D' of the unit pixels 400A and 400B, respectively. For convenience of description, only differences between the unit pixels 400A and 400B and the unit pixel 100 described above will be described.

Referring to FIG. 8A, the unit pixel 400A of the image sensor 10 (see FIG. 1) may include the device isolation structure 120 which is partially opened along a boundary region between the photoelectric device portion PA and the storage device portion SA, and the overflow gate OG that is in the boundary region where the device isolation structure 120 is opened. In the unit pixel 400A of the present embodiment, the overflow gate OG may be formed as a dual gate electrode 450A.

The dual gate electrode 450A may be disposed to extend from the first surface 110F1 of the substrate 110 into the substrate 110. The gate insulating layer 130 may be conformally disposed on the first surface 110F1 of the substrate 110, and the dual gate electrode 450A may fill a part of the substrate 110 on the gate insulating layer 130.

Referring to FIG. 8B, the unit pixel 400B of the image sensor 10 (see FIG. 1) may include the device isolation structure 120 which is partially opened along the boundary region between the photoelectric device portion PA and the storage device portion SA, and the overflow gate OG that is in the boundary region where the device isolation structure 120 is opened. In the unit pixel 400B of the present embodiment, the overflow gate OG may be formed as a triple gate electrode 450B

The triple gate electrode 450B may include a region extending on the substrate 110 along the first surface 110F1 of the substrate 110, e.g., in parallel to the first surface 110F1 of the substrate 110, and a region extending from the first surface 110F1 of the substrate 110 into the substrate 110, e.g., perpendicularly to the first surface 110F1 of the substrate 110. The gate insulating layer 130 may be conformally disposed on the first surface 110F1 of the substrate 110, and the triple gate electrode 450B may fill a part of the substrate 110 on the gate insulating layer 130 and protrude upward from the substrate 110.

Figure 9A:
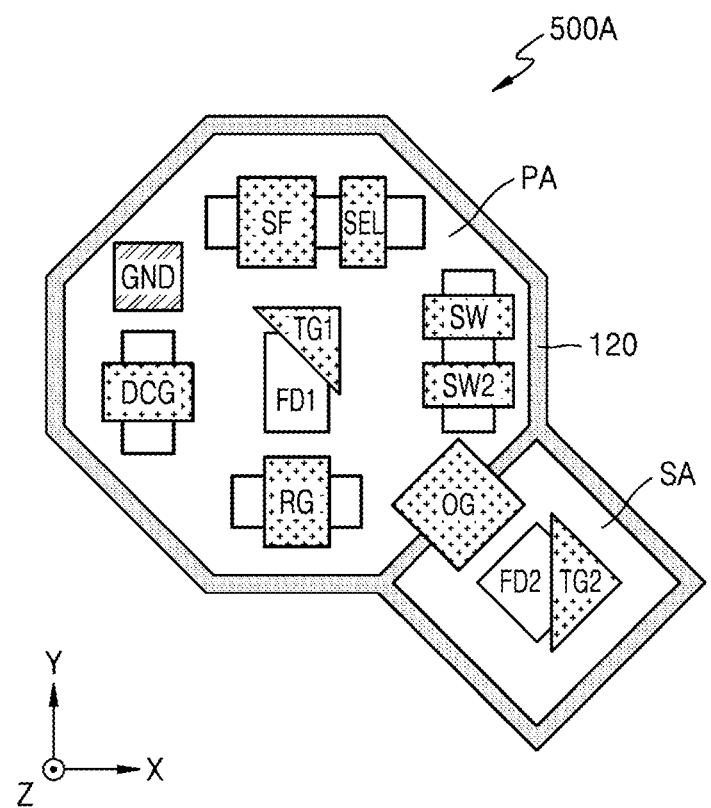
FIGS. 9A to 9C are plan views illustrating unit pixels of an image sensor according to an embodiment.
Figure 9B:
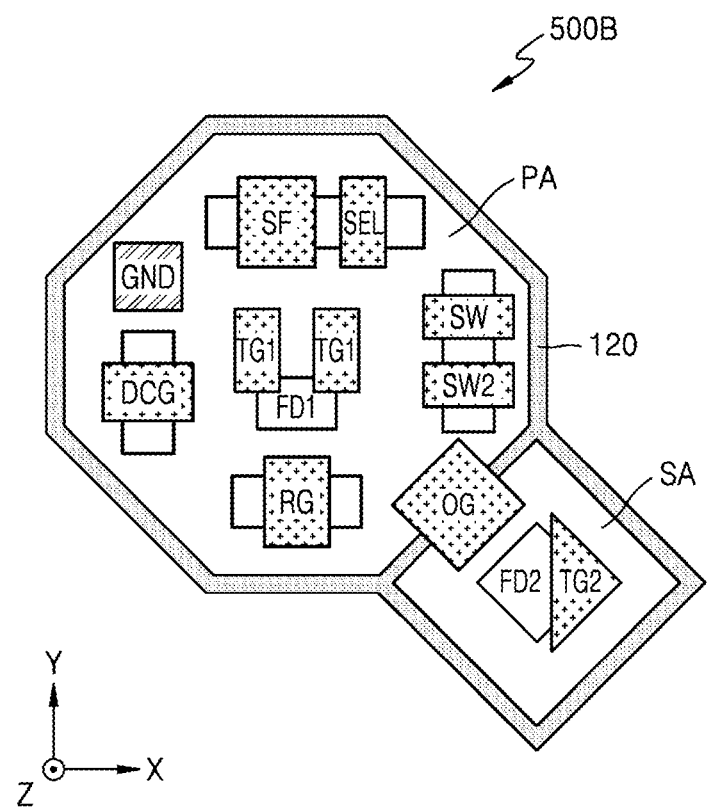
Figure 9C:
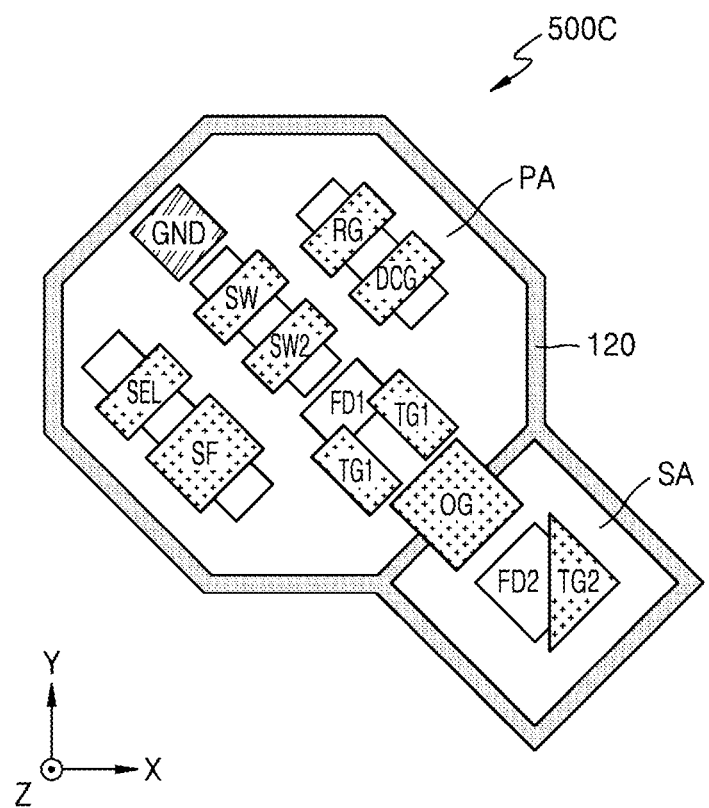

FIGS. 9A to 9C are plan views respectively illustrating unit pixels 500A, 500B, and 500C of the image sensor 10 according to an embodiment. It is noted that while the arrangement of gates included in the photoelectric device portion PA and the storage device portion SA is not limited to those shown and any design changes may be possible, the arrangement of the overflow gate OG may be fixed to an open region of the device isolation structure 120 in the unit pixels 500A, 500B, and 500C of the present embodiment.

In a plan view of the unit pixels 500A, 500B, and 500C of the present embodiment, the photoelectric device portion PA has an octagonal shape, the storage device portion SA has a rectangular shape, and a planar area of the photoelectric device portion PA may be greater, e.g., larger, than a planar area of the storage device portion SA. In addition, each of the unit pixels 500A, 500B, and 500C may include the device isolation structure 120 which is partially opened along a boundary region between the photoelectric device portion PA and the storage device portion SA.

The first transfer gate TG1, the overflow gate OG, and the second transfer gate TG2 may be sequentially arranged in a line. The photocharges accumulated in the photodiode PD may be transferred to the storage diode SD and the first and second floating diffusion regions FD1 and FD2 through a path formed by each gate.

Referring to FIG. 9A, the unit pixel 500A may include the photoelectric device portion PA and the storage device portion SA including a plurality of gates.

The photoelectric device portion PA may include the first floating diffusion region FD1, the first transfer gate TG1, the reset gate RG, the source follower gate SF, the selection gate SEL, and the switch device gate SW, and may optionally include the second switch device gate SW2 and/or the dual conversion gain gate DCG. The storage device portion SA may include the second floating diffusion region FD2 and the second transfer gate TG2. The overflow gate OG may be disposed to cross the photoelectric device portion PA and the storage device portion SA.

In the unit pixel 500A of the present embodiment, the first transfer gate TG1 disposed in the first floating diffusion region FD1 of the photoelectric device portion PA may be configured as a single vertical gate electrode.

Referring to FIG. 9B, the unit pixel 500B may include the photoelectric device portion PA and the storage device portion SA including a plurality of gates.

The photoelectric device portion PA may include the first floating diffusion region FD1, the first transfer gate TG1, the reset gate RG, the source follower gate SF, the selection gate SEL, and the switch device gate SW, and may optionally include the second switch device gate SW2 and/or the dual conversion gain gate DCG. The storage device portion SA may include the second floating diffusion region FD2 and the second transfer gate TG2. The overflow gate OG may be disposed to cross the photoelectric device portion PA and the storage device portion SA.

In the unit pixel 500B of the present embodiment, the first transfer gate TG1 disposed in the first floating diffusion region FD1 of the photoelectric device portion PA may be configured as a dual vertical gate electrode.

Referring to FIG. 9C, the unit pixel 500C may include the photoelectric device portion PA and the storage device portion SA including a plurality of gates.

The photoelectric device portion PA may include the first floating diffusion region FD1, the first transfer gate TG1, the reset gate RG, the source follower gate SF, the selection gate SEL, and the switch device gate SW, and may optionally include the second switch device gate SW2 and/or the dual conversion gain gate DCG. Here, the first transfer gate TG1 may be configured as a dual vertical gate electrode. The storage device portion SA may include the second floating diffusion region FD2 and the second transfer gate TG2. The overflow gate OG may be disposed to cross the photoelectric device portion PA and the storage device portion SA.

In the unit pixel 500C of the present embodiment, the overflow gate OG may be disposed to face and neighbor the first transfer gate TG1 disposed in the first floating diffusion region FD1 of the photoelectric device portion PA to control an overflow path more elaborately.

Figure 10:
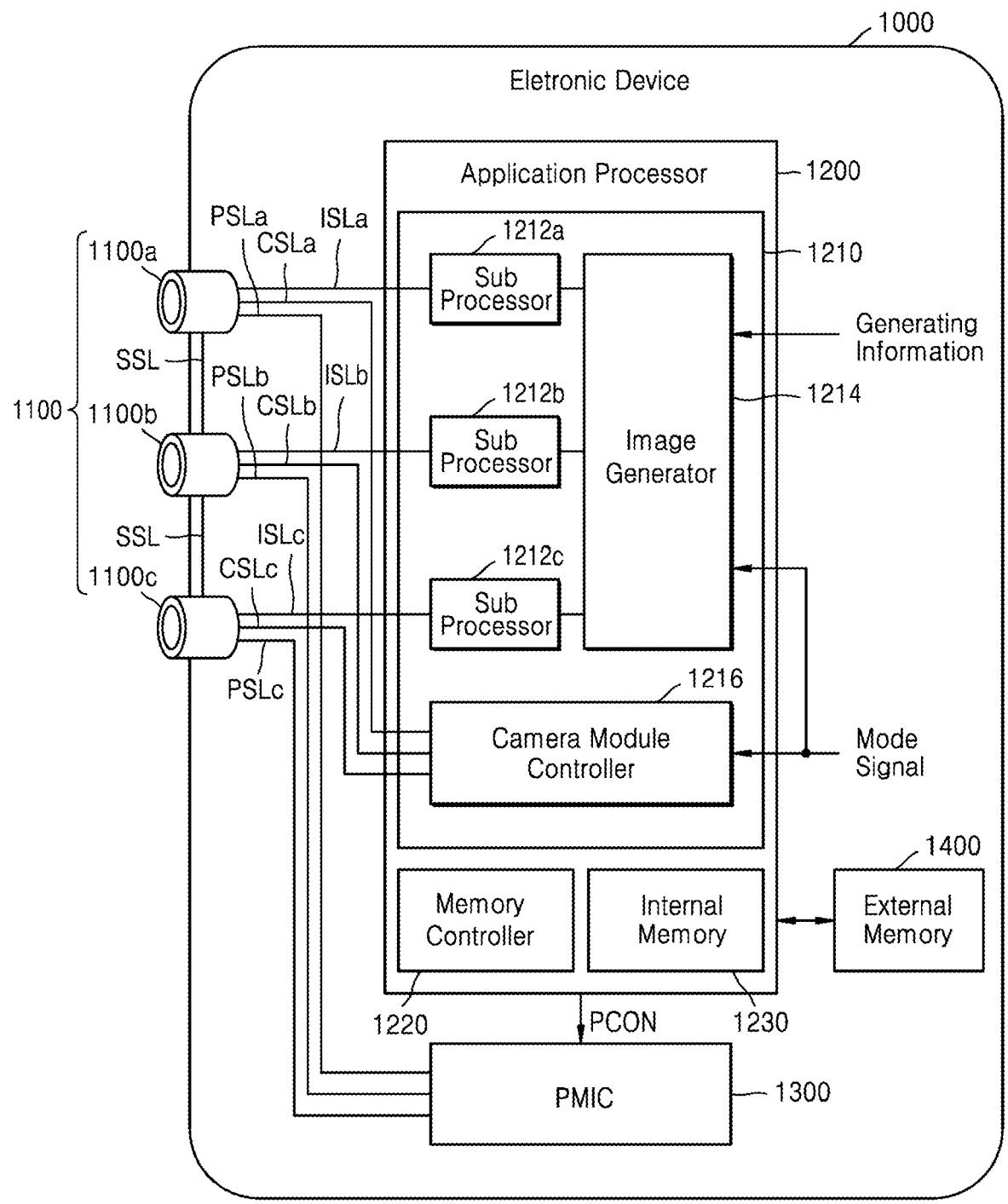
FIG. 10 is a block diagram of an electronic device including multi-camera modules.
Figure 11:
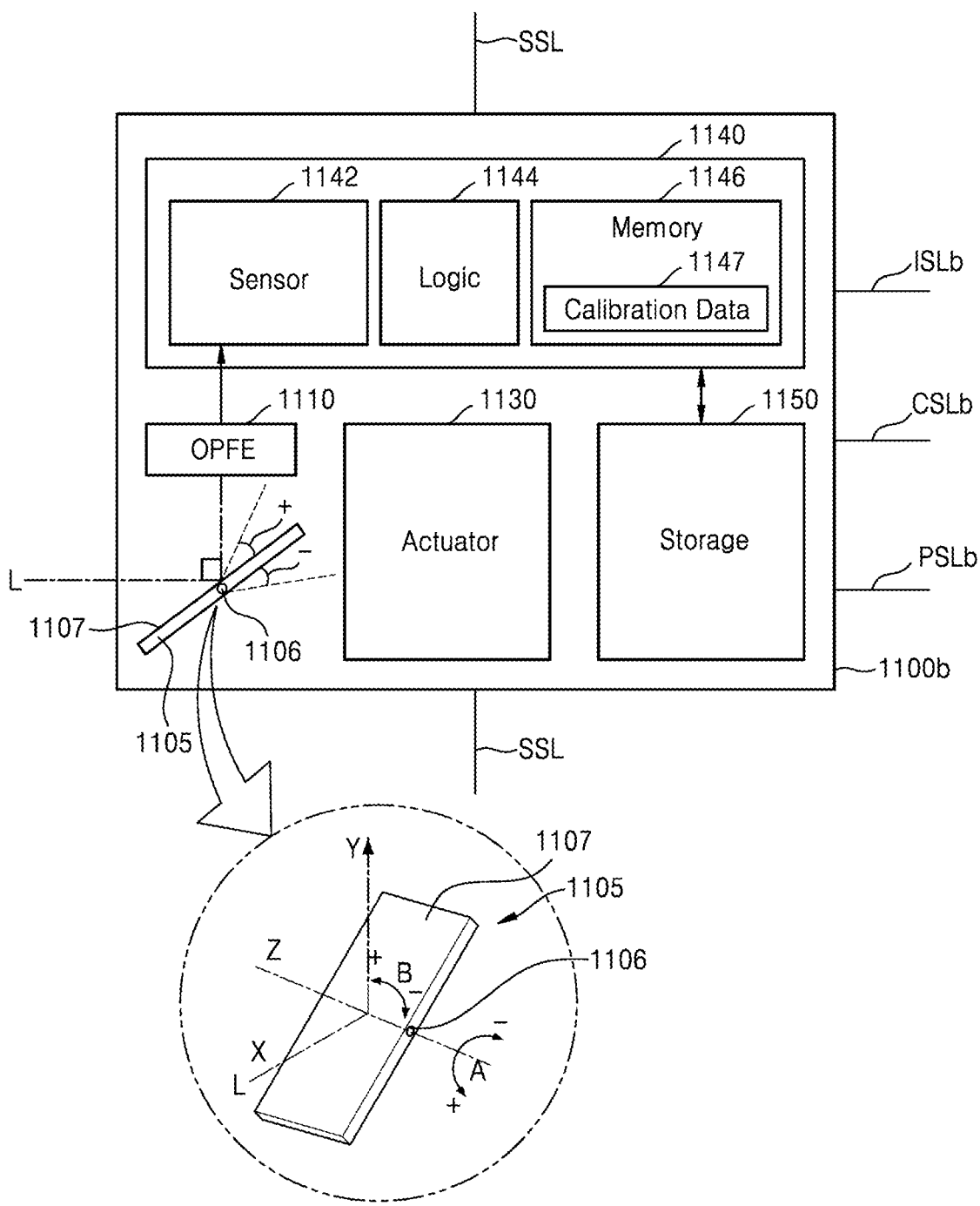
FIG. 11 is a detailed block diagram of a camera module of FIG. 10.

FIG. 10 is a block diagram of an electronic device 1000 including multi-camera modules, and FIG. 11 is a detailed block diagram of a camera module 1100b of FIG. 10.

Referring to FIG. 10, the electronic device 1000 may include a camera module group 1100, an application processor 1200, a power management integrated circuit (PMIC) 1300, and an external memory 1400.

The camera module group 1100 may include a plurality of camera modules 1100a, 1100b, and 1100c. An embodiment in which three camera modules 1100a, 1100b, and 1100c are disposed is shown, but the embodiments are not limited thereto, e.g., the camera module group 1100 may be modified to include only two camera modules or n camera modules (where n is a natural number greater than or equal to 4).

Referring to FIG. 11, the camera module 1100b may include a prism 1105, an optical path folding element (OPFE) 1110, an actuator 1130, an image sensing device 1140, and a storage 1150. Here, the configuration of the camera module 1100b is described in more detail, but the following description may be equally applied to the other camera modules 1100a and 1100c according to embodiments.

The prism 1105 may include a reflective surface 1107 of a light reflective material to modify a path of light L incident from the outside. In some embodiments, the prism 1105 may change the path of the light L incident in the first direction (X direction) to the second direction (Y direction) perpendicular to the first direction (X direction). In addition, the prism 1105 may rotate the reflective surface 1107 of the light reflective material in an A direction with respect to a central axis 1106 or rotate the central axis 1106 in a B direction to change the path of the light L incident in the first direction (X direction) to the second direction (Y direction) perpendicular to the first direction (X direction). At this time, the OPFE 1110 may also move in the third direction (Z direction) perpendicular to the first direction (X direction) and the second direction (Y direction).

In some embodiments, as shown, the maximum angle of rotation of the prism 1105 in the A direction may be less than or equal to 15° in a positive (+) A direction and greater than 15° in a negative (−) A direction. In some embodiments, the prism 1105 may move about 20°, e.g., between about 10° and about 20°, or between about 15° and about 20° in the positive (+) or negative (−) B direction, where the prism 1105 may move at the same angle in the positive (+) or negative (−) B direction, or to a nearly similar angle within the range of about 1°. In some embodiments, the prism 1105 may move the reflective surface 1107 of the light reflective material in the third direction (Z direction) parallel to an extension direction of the central axis 1106.

The OPFE 1110 may include, e.g., an optical lens including m groups (where m is a natural number). The m groups of the optical lens may move in the second direction (Y direction) to change an optical zoom ratio of the camera module 1100b. For example, in a case where the basic optical zoom ratio of the camera module 1100b is z, when the m groups of the optical lens included in the OPFE 1110 move, the optical zoom ratio of the camera module 1100b may be changed to 3z, 5z, 5z or higher.

The actuator 1130 may move the OPFE 1110 or the optical lens to a specific location. For example, the actuator 1130 may adjust the location of the optical lens so that an image sensor 1142 is located at a focal length of the optical lens for accurate sensing.

The image sensing device 1140 may include the image sensor 1142, a control logic 1144, and a memory 1146. The image sensor 1142 may sense an image of a sensing target using the light L provided through the optical lens. The control logic 1144 may control the overall operation of the camera module 1100b. For example, the control logic 1144 may control an operation of the camera module 1100b according to a control signal provided through a control signal line CSLb.

The memory 1146 may store information necessary for the operation of the camera module 1100b, e.g., calibration data 1147. The calibration data 1147 may include information necessary for the camera module 1100b to generate image data using the light L provided from the outside. The calibration data 1147 may include, e.g., information about a degree of rotation described above, information about a focal length, information about an optical axis, etc. When the camera module 1100b is implemented in the form of a multi-state camera in which the focal length varies according to the location of the optical lens, the calibration data 1147 may include a focal length value of the optical lens for each location (or state) and information related to auto focusing The storage 1150 may store image data sensed by the image sensor 1142. The storage 1150 may be disposed outside the image sensing device 1140, and may be implemented in the form stacked with a sensor chip constituting the image sensing device 1140. In some embodiments, the storage 1150 may be implemented as an Electrically Erasable Programmable Read-Only Memory (EEPROM).

Referring to FIGS. 10 and 11 together, in some embodiments, each of the plurality of camera modules 1100a, 1100b, and 1100c may include the actuator 1130. Accordingly, each of the plurality of camera modules 1100a, 1100b, and 1100c may include the same or different calibration data 1147 according to an operation of the actuator 1130 included therein.

In some embodiments, one camera module (e.g., 1100b) of the plurality of camera modules 1100a, 1100b, 1100c may be a folded lens type camera module including the prism 1105 and the OPFE 1110 described above, and the remaining camera modules (e.g., 1100a and 1100c) may be a vertical type camera module that does not include the prism 1105 and the OPFE 1110.

In some embodiments, one camera module (e.g., 1100c) of the plurality of camera modules 1100a, 1100b, and 1100c may be a vertical type depth camera that extracts depth information using, e.g., infrared ray (IR). In this case, the application processor 1200 may merge image data provided from the depth camera and image data provided from another camera module (e.g., 1100a or 1100b) to generate a 3D depth image.

In some embodiments, at least two camera modules (e.g., 1100a and 1100b) among the plurality of camera modules 1100a, 1100b, and 1100c may have different fields of view. In this case, optical lenses of at least two camera modules (e.g., 1100a and 1100b) among the plurality of camera modules 1100a, 1100b, and 1100c may be different from each other.

Also, in some embodiments, fields of view of the plurality of camera modules 1100a, 1100b, and 1100c may be different from each other. In this case, the optical lenses included in the plurality of camera modules 1100a, 1100b, and 1100c may also be different from each other.

In some embodiments, the plurality of camera modules 1100a, 1100b, and 1100c may be disposed to be physically separated from each other. That is, the plurality of camera modules 1100a, 1100b, and 1100c do not divide and use a sensing region of one image sensor 1142, but the independent image sensor 1142 may be disposed inside of each of the plurality of camera modules 1100a, 1100b, and 1100c.

Referring back to FIG. 10, the application processor 1200 may include an image processing apparatus 1210, a memory controller 1220, and an internal memory 1230. The application processor 1200 may be implemented separately from the plurality of camera modules 1100a, 1100b, and 1100c. For example, the application processor 1200 and the plurality of camera modules 1100a, 1100b, and 1100c may be implemented by being separated from each other as separate semiconductor chips.

The image processing apparatus 1210 may include a plurality of sub image processors 1212a, 1212b, and 1212c, an image generator 1214, and a camera module controller 1216.

The image processing apparatus 1210 may include a plurality of sub image processors 1212a, 1212b, and 1212c corresponding to the number of the plurality of camera modules 1100a, 1100b, and 1100c.

The image data generated by each of the camera modules 1100a, 1100b, and 1100c may be provided to the corresponding sub image processors 1212a, 1212b, and 1212c through image signal lines ISLa, ISLb, and ISLc separated from each other. For example, the image data generated by the camera module 1100a may be provided to the sub image processor 1212a through the image signal line ISLa, the image data generated by the camera module 1100b may be provided to the sub image processor 1212b through the image signal line ISLb, and the image data generated by the camera module 1100c may be provided to the sub image processor 1212c through the image signal line ISLc. Such a transfer of the image data may be performed using, e.g., a camera serial interface (CSI) based on a Mobile Industry Processor Interface (MIPI).

Meanwhile, in some embodiments, one sub image processor may be arranged to correspond to a plurality of camera modules. For example, the sub image processor 1212a and the sub image processor 1212c are not separated from each other as shown, but may be integrated into one sub image processor, and the image data provided by the camera module 1100a and the camera module 1100c may be selected through a selection device (e.g., a multiplexer) and then provided to the integrated sub image processor.

The image data provided to each of the sub image processors 1212a, 1212b, and 1212c may be provided to the image generator 1214. The image generator 1214 may generate an output image using the image data provided by each of the sub image processors 1212a, 1212b, and 1212c according to generating information or a mode signal.

Specifically, the image generator 1214 may generate the output image by merging at least some of the image data generated by the camera modules 1100a, 1100b, and 1100c having different fields of view according to the generating information or the mode signal. Also, the image generator 1214 may generate the output image by selecting any one of the image data generated by the camera modules 1100a, 1100b, and 1100c having different fields of view according to the generating information or the mode signal.

In some embodiments, the generating information may include a zoom signal or a zoom factor. Also, in some embodiments, the mode signal may be, e.g., a signal based on a mode selected by a user.

When the generating information is the zoom signal (the zoom factor), and the camera modules 1100a, 1100b, and 1100c have different fields of view, the image generator 1214 may perform different operations according to a type of the zoom signal. For example, when the zoom signal is a first signal, the image generator 1214 may merge the image data output from the camera module 1100a and the image data output from the camera module 1100c, and then generate the output image, by using a merged image signal and the image data output from the camera module 1100b that is not used for merging. When the zoom signal is a second signal different from the first signal, the image generator 1214 does not perform such image data merging, and select any one of the image data output from the camera modules 1100a, 1100b, and 1100c and generate the output image. However, the embodiments are not limited thereto, and a method of processing image data may be modified and implemented as needed.

In some embodiments, the image generator 1214 may receive a plurality of pieces of image data having different exposure times from at least one of the plurality of sub image processors 1212a, 1212b, and 1212c, perform HDR processing on the plurality of pieces of image data, and generate merged image data having an increased dynamic range.

The camera module controller 1216 may provide a control signal to each of the camera modules 1100a, 1100b, and 1100c. The control signals generated by the camera module controller 1216 may be provided to the corresponding camera modules 1100a, 1100b, and 1100c respectively through control signal lines CSLa, CSLb, and CSLc separated from each other.

Any one of the plurality of camera modules 1100a, 1100b, and 1100c may be designated as a master camera module (e.g., 1100b) according to the generating information or the mode signal including the zoom signal, and the remaining camera modules (e.g., 1100a and 1100c) may be designated as slave cameras. Such information may be included in the control signals and provided to the corresponding camera modules 1100a, 1100b, and 1100c respectively through the control signal lines CSLa, CSLb, and CSLc separated from each other.

A camera module operating as a master and a slave may be changed according to a zoom factor or an operation mode signal. For example, when a field of view of the camera module 1100a is wider than a field of view of the camera module 1100b, and the zoom factor indicates a low zoom ratio, the camera module 1100b may operate as the master, and the camera module 1100a may operate as the slave. To the contrary, when the zoom factor indicates a high zoom ratio, the camera module 1100a may operate as the master and the camera module 1100b may operate as the slave.

In some embodiments, the control signal provided from the camera module controller 1216 to each of the camera modules 1100a, 1100b, and 1100c may include a sync enable signal. For example, when the camera module 1100b is the master camera and the camera modules 1100a and 1100c are the slave cameras, the camera module controller 1216 may transmit the sync enable signal to the camera module 1100b. The camera module 1100b receiving the sync enable signal may generate a sync signal based on the received sync enable signal, and provide the generated sync signal to the camera modules 1100a and 1100c through a sync signal line SSL. The camera module 1100b and the camera modules 1100a and 1100c may be synchronized with the sync signal to transmit the image data to the application processor 1200.

In some embodiments, the control signal provided from the camera module controller 1216 to the plurality of camera modules 1100a, 1100b, and 1100c may include mode information according to the mode signal. Based on the mode information, the plurality of camera modules 1100a, 1100b, and 1100c may operate in a first operation mode and a second operation mode in relation to a sensing speed.

The plurality of camera modules 1100a, 1100b, and 1100c may generate an image signal at a first speed (e.g., generate an image signal at a first frame rate) in the first operation mode to encode the image signal at a second speed higher than the first speed (e.g., encode the image signal at a second frame rate higher than the first frame rate), and transmit the encoded image signal to the application processor 1200.

The application processor 1200 may store the received image signal, that is, the encoded image signal, in the memory 1230 provided therein or the external memory 1400 outside the application processor 1200, and then, read and decode the encoded image signal from the memory 1230 or the external memory 1400, and display image data generated based on the decoded image signal. For example, a corresponding sub processor among the plurality of sub image processors 1212a, 1212b, and 1212c of the image processing apparatus 1210 may perform decoding, and may also perform image processing on the decoded image signal.

The plurality of camera modules 1100a, 1100b, and 1100c may generate an image signal at a third rate lower than the first rate in the second operation mode (for example, generate an image signal at a third frame rate lower than the first frame rate), and may transmit the image signal to the application processor 1200. The image signal provided to the application processor 1200 may be an unencoded signal. The application processor 1200 may perform image processing on the received image signal or store the image signal in the memory 1230 or the external memory 1400.

The PMIC 1300 may supply power, e.g., a power voltage, to each of the plurality of camera modules 1100a, 1100b, and 1100c. For example, the PMIC 1300 may supply first power to the camera module 1100a through a power signal line PSLa, supply second power to the camera module 1100b through a power signal line PSLb, and supply third power to the camera module 1100c through a power signal line PSLc, under control by the application processor 1200.

The PMIC 1300 may generate power corresponding to each of the plurality of camera modules 1100a, 1100b, and 1100c in response to a power control signal PCON from the application processor 1200, and also adjust a level of the power. The power control signal PCON may include a power adjustment signal for each operation mode of the plurality of camera modules 1100a, 1100b, and 1100c. For example, the operation mode may include a low power mode, and in this regard, the power control signal PCON may include information about a camera module operating in the low power mode and a set power level. Levels of the power provided to the plurality of camera modules 1100a, 1100b, and 1100c may be the same or different from each other. Also, the levels of the power may be changed dynamically.

Figure 12:
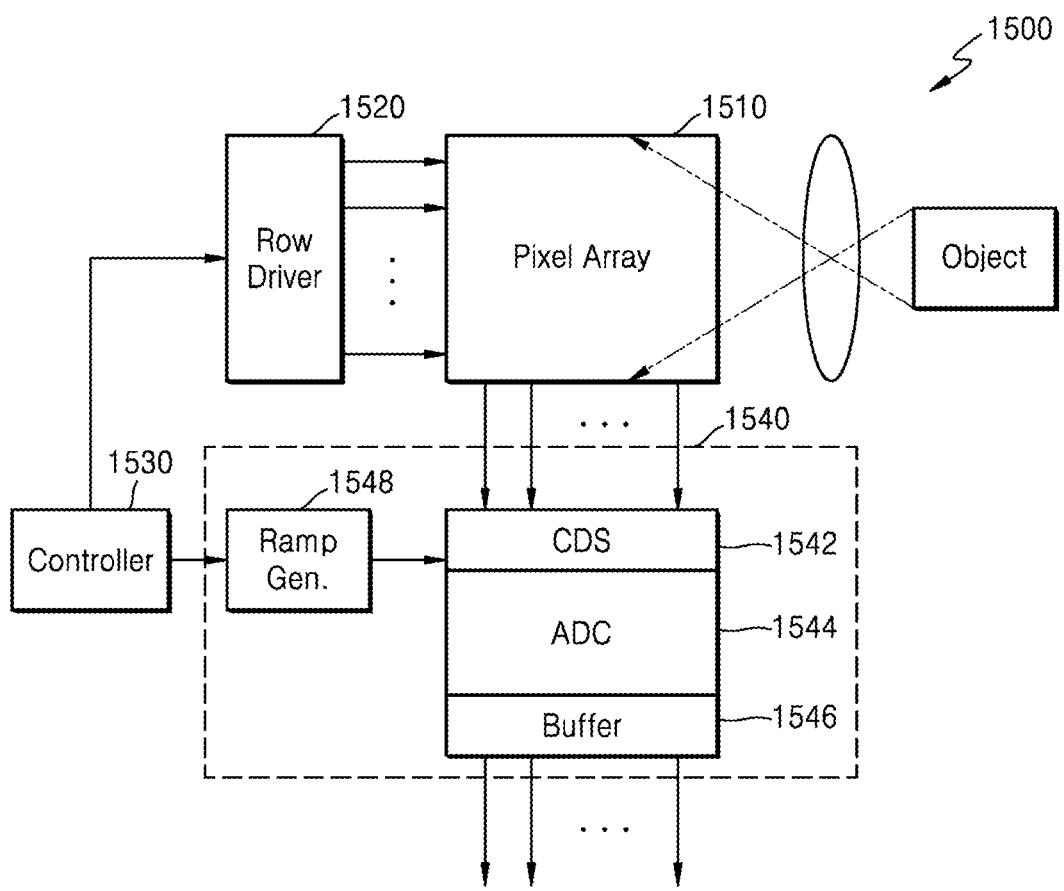
FIG. 12 is a block diagram illustrating a configuration of an image sensor according to embodiments.

FIG. 12 is a block diagram illustrating a configuration of an image sensor 1500 according to embodiments.

Referring to FIG. 12, the image sensor 1500 may include a pixel array 1510, a controller 1530, a row driver 1520, and a pixel signal processor 1540.

The image sensor 1500 may include the image sensor 10 described above. The pixel array 1510 may include a plurality of two-dimensionally arranged unit pixels, and each unit pixel may include a photoelectric conversion device. The photoelectric conversion device may absorb light to generate photocharges, and an electrical signal (an output voltage) according to the generated photocharges may be provided to the pixel signal processor 1540 through a vertical signal line.

The unit pixels included in the pixel array 1510 may provide an output voltage one at a time in a row unit, and accordingly, the unit pixels belonging to one row of the pixel array 1510 may be simultaneously activated by a selection signal output by the row driver 1520. The unit pixel belonging to a selected row may provide an output voltage according to the absorbed light to an output line of a corresponding column.

The controller 1530 may control the pixel array 1510 to absorb light and accumulate photocharges or temporarily store the accumulated photocharges, and the row driver to output an electrical signal according to the stored photocharges to the outside of the pixel array 1510. Also, the controller 1530 may control the pixel signal processor 1540 to measure the output voltage provided by the pixel array 1510.

The pixel signal processor 1540 may include a correlated double sampler (CDS) 1542, an analog-to-digital converter (ADC) 1544, and a buffer 1546. The CDS 1542 may sample and hold the output voltage provided by the pixel array 1510.

The CDS 1542 may double-sample a specific noise level and a level according to the generated output voltage, and output a level corresponding to a difference therebetween. Also, the CDS 1542 may receive ramp signals generated by a ramp signal generator 1548, compare the ramp signals with each other, and output a comparison result.

The ADC 1544 may convert an analog signal corresponding to the level received from the CDS 1542 into a digital signal. The buffer 1546 may latch the digital signal, and latched signals may be sequentially output to the outside of the image sensor 1500 and transmitted to an image processor (not shown).

By way of summation and review, a high dynamic range (HDR) operation that increases an operating range is required to simultaneously improve low illuminance and high illuminance performance. Although attempts have been made to use a multiple exposure method for the HDR operation, because the multiple exposure method is vulnerable to a high speed motion, image sensors have been developed to add a new structure to pixels.

Embodiments provide an image sensor including an overflow gate providing a path for transferring photocharges overflowing from a photoelectric device portion to a storage device portion, by using a device isolation structure which is partially opened at a boundary between the photoelectric device portion and the storage device portion.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor, comprising:
a substrate including a plurality of unit pixels;
a photoelectric device portion and a storage device portion in each of the plurality of unit pixels, the photoelectric device portion and the storage device portion being within the substrate;
a device isolation structure in the substrate and partitioning the plurality of unit pixels from each other, the device isolation structure, when viewed in a plan view, including a first portion enclosing a region where the photoelectric device portion and the storage device portion are disposed and a second portion connected to the first portion and disposed at a boundary between the photoelectric device portion and the storage device portion, wherein the second portion being is partially open at a the boundary between the photoelectric device portion and the storage device portion; and
an overflow gate between the photoelectric device portion and the storage device portion, the overflow gate providing an overflow path between the photoelectric device portion and the storage device portion according to a certain voltage.

2. The image sensor as claimed in claim 1, wherein the overflow gate is at the boundary between the photoelectric device portion and the storage device portion at a region where the device isolation structure is open.

3. The image sensor as claimed in claim 2, wherein:
when viewed in the plan view, each of opposite sides of the overflow gate faces the device isolation structure, and
when viewed in a side cross-section view, the device isolation structure is not on a lower surface of the overflow gate.

4. The image sensor as claimed in claim 2, wherein, when viewed in a the plan view, an extension direction of the device isolation structure at the boundary between the photoelectric device portion and the storage device portion and a direction of the overflow path are orthogonal to each other.

5. The image sensor as claimed in claim 1, further comprising
a first transfer gate connected to the photoelectric device portion and
a second transfer gate connected to the storage device portion,
at least one of the first transfer gate, the second transfer gate, and the overflow gate having a vertical gate structure.

6. The image sensor as claimed in claim 1, further comprising:
a micro lens on the photoelectric device portion, the micro lens being configured to concentrate an incident light, and
a light blocking pattern on the storage device portion, the light blocking pattern being configured to block the incident light.

7. The image sensor as claimed in claim 1, wherein the device isolation structure includes at least one of a frontside deep trench isolation (FDTI) pattern and a backside deep trench isolation (BDTI) pattern.

8. The image sensor as claimed in claim 1, further comprising
a floating diffusion region on one side of the photoelectric device portion, the photoelectric device portion being between the storage device portion and the floating diffusion region.

9. The image sensor as claimed in claim 1, wherein, when viewed in the plan view, the photoelectric device portion has an octagonal shape, the storage device portion has a rectangular shape, and a planar area of the photoelectric device portion is larger than a planar area of the storage device portion.

10. The image sensor as claimed in claim 9, wherein:
when viewed in the plan view, four of the plurality of unit pixels are arranged to have the storage device portion of one of the four of the plurality of unit pixels in a center, the photoelectric device portion of each of the four of the plurality of unit pixels being adjacent to the storage device portion of the one of the four of the plurality of unit pixels in the center, and
the device isolation structure is partially open only at a boundary between the storage device portion of the one of the four of the plurality of unit pixels in the center and the photoelectric device portion of a same unit pixel among the four of the plurality of unit pixels.

11. An image sensor, comprising:
a photoelectric device portion covered by a micro lens, the photoelectric device portion being configured to accumulate photocharges generated by an incident light focused on the micro lens for a predetermined period of time;

a storage device portion not covered by the micro lens, the storage device portion being configured to receive and store some of the photocharges accumulated in the photoelectric device portion;

a device isolation structure surrounding the photoelectric device portion and the storage device portion, the device isolation structure, when viewed in a plan view, including a first portion enclosing a region where the photoelectric device portion and the storage device portion are disposed and a second portion connected to the first portion and disposed at a boundary between the photoelectric device portion and the storage device portion, wherein the second portion is partially open at the boundary between the photoelectric device portion and the storage device portion; and an overflow gate in a region in which the device isolation structure is open between the photoelectric device portion and the storage device portion, the overflow gate being configured to chop the predetermined period of time and to provide an overflow path.

12. The image sensor as claimed in claim 11, wherein the overflow path transfers some of the photocharges overflowing from the photoelectric device portion to the storage device portion.

13. The image sensor as claimed in claim 12, wherein the overflow path is configured to be repeatedly formed with a constant interval for the predetermined period of time due to chopping.

14. The image sensor as claimed in claim 11, further comprising:

a first transfer gate transferring the photocharges stored in the photoelectric device portion to a first floating diffusion region; and a second transfer gate transferring the photocharges stored in the storage device portion to a second floating diffusion region.

15. The image sensor as claimed in claim 14, wherein the overflow gate is between the first transfer gate and the second transfer gate.

16. An image sensor, comprising:

a substrate including a plurality of unit pixels;

a photoelectric device portion and a storage device portion in each of the plurality of unit pixels, the photoelectric device portion and the storage device portion being within the substrate;

a device isolation structure surrounding the plurality of unit pixels, the device isolation structure, when viewed in a plan view, including a first portion enclosing a region where the photoelectric device portion and the storage device portion are disposed and a second portion connected to the first portion and disposed at a boundary between the photoelectric device portion and the storage device portion, wherein the second portion is partially open at the boundary between the photoelectric device portion and the storage device portion;

an overflow gate in a region in which the device isolation structure is open, the overflow gate being configured to provide an overflow path for transferring some of photocharges overflowing from the photoelectric device portion to the storage device portion;

a first transfer gate transferring the photocharges stored in the photoelectric device portion to a first floating diffusion region; and a second transfer gate transferring the photocharges stored in the storage device portion to a second floating diffusion region.

17. The image sensor as claimed in claim 16, further comprising a conversion gain gate and a capacitor between the photoelectric device portion and the first floating diffusion region.

18. The image sensor as claimed in claim 16, further comprising a switch gate and a high density capacitor around the second floating diffusion region.

19. The image sensor as claimed in claim 16, further comprising:

a conversion gain gate and a capacitor between the photoelectric device portion and the first floating diffusion region; and a switch gate and a high density capacitor around the second floating diffusion region.

20. The image sensor as claimed in claim 16, wherein the overflow gate is between the first transfer gate and the second transfer gate, the overflow path being repeatedly formed with a constant interval.

* * * * *